United States Patent
Lok et al.

(10) Patent No.: US 11,632,121 B1
(45) Date of Patent: Apr. 18, 2023

(54) CALIBRATION OF TIMING SKEWS IN A MULTI-CHANNEL INTERLEAVED ANALOG-TO-DIGITAL CONVERTER (ADC) BY AUTO-CORRELATION OF MUXED-TOGETHER CHANNELS IN BINARY OUTPUT TREE

(71) Applicant: Caelus Technologies Limited, Hong Kong (HK)

(72) Inventors: Chi Fung Lok, Hong Kong (HK); Xiaoyong He, Hong Kong (HK); Zhi Jun Li, Guangzhou (CN)

(73) Assignee: Caelus Technologies Limited, Hong Kong (HK)

( * ) Notice: Subject to any disclaimer, the term of this patent is extended or adjusted under 35 U.S.C. 154(b) by 40 days.

(21) Appl. No.: 17/455,471

(22) Filed: Nov. 18, 2021

(51) Int. Cl.
| | |
|---|---|
| H03M 1/10 | (2006.01) |
| H03M 1/12 | (2006.01) |
| H03M 1/38 | (2006.01) |
| H03M 1/06 | (2006.01) |

(52) U.S. Cl.
CPC ........ *H03M 1/1033* (2013.01); *H03M 1/0624* (2013.01); *H03M 1/1023* (2013.01); *H03M 1/12* (2013.01); *H03M 1/38* (2013.01)

(58) Field of Classification Search
CPC ........ H03M 1/1033; H03M 1/12; H03M 1/38; H03M 1/0624; H03M 1/1023
See application file for complete search history.

(56) References Cited

U.S. PATENT DOCUMENTS

| | | |
|---|---|---|
| 7,312,734 B2 | 12/2007 | McNeill et al. |
| 8,519,875 B2 | 8/2013 | Straayer et al. |
| 8,872,680 B2 | 10/2014 | Ali |
| 9,608,652 B2 | 3/2017 | Lee et al. |
| 10,312,927 B1 | 6/2019 | Mirhaj et al. |
| 2022/0057522 A1* | 2/2022 | Mostafanezhad ..... G01S 17/931 |

OTHER PUBLICATIONS

Naoki Kurosawa et. al, "Explicit Analysis of Channel Mismatch Effects in Time-Interleaved ADC Systems", IEEE TCAS I, vol. 48, No. 3, Mar. 2001.
Behzad Razavi, "Design Considerations for Interleaved ADCs", IEEE JSSC, vol. 48, No. 8, Aug. 2013.
Hegong Wei et. al., "An 8 Bit 4GS/s 120mW CMOS ADC", IEEE JSSC, vol. 49, No. 8, Aug. 2014.

* cited by examiner

*Primary Examiner* — Joseph J Lauture
(74) *Attorney, Agent, or Firm* — gPatent LLC; Stuart T. Auvinen

(57) ABSTRACT

An N-channel interleaved Analog-to-Digital Converter (ADC) has a variable delay added to each ADC's input sampling clock. The variable delays are each programmed by a Successive-Approximation-Register (SAR) during calibration to minimize timing skews between channels. An auto-correlator generates a sign of a correlation error for a pair of ADC digital outputs. SAR bits are tested with the correlation sign bit determining when to add or subtract SAR bits. First all pairs are calibrated in a first level of a binary tree of mux-correlators. Then skews between remote pairs and groups are calibrated in upper levels of the binary tree using auto-correlators with inputs muxed from groups of ADC outputs input to the binary tree of mux-correlators. The binary tree of mux-correlators can include bypasses for odd and non-binary values of N. Sampling clock and component timing skews are reduced to one LSB among both adjacent channels and remote channels.

20 Claims, 23 Drawing Sheets

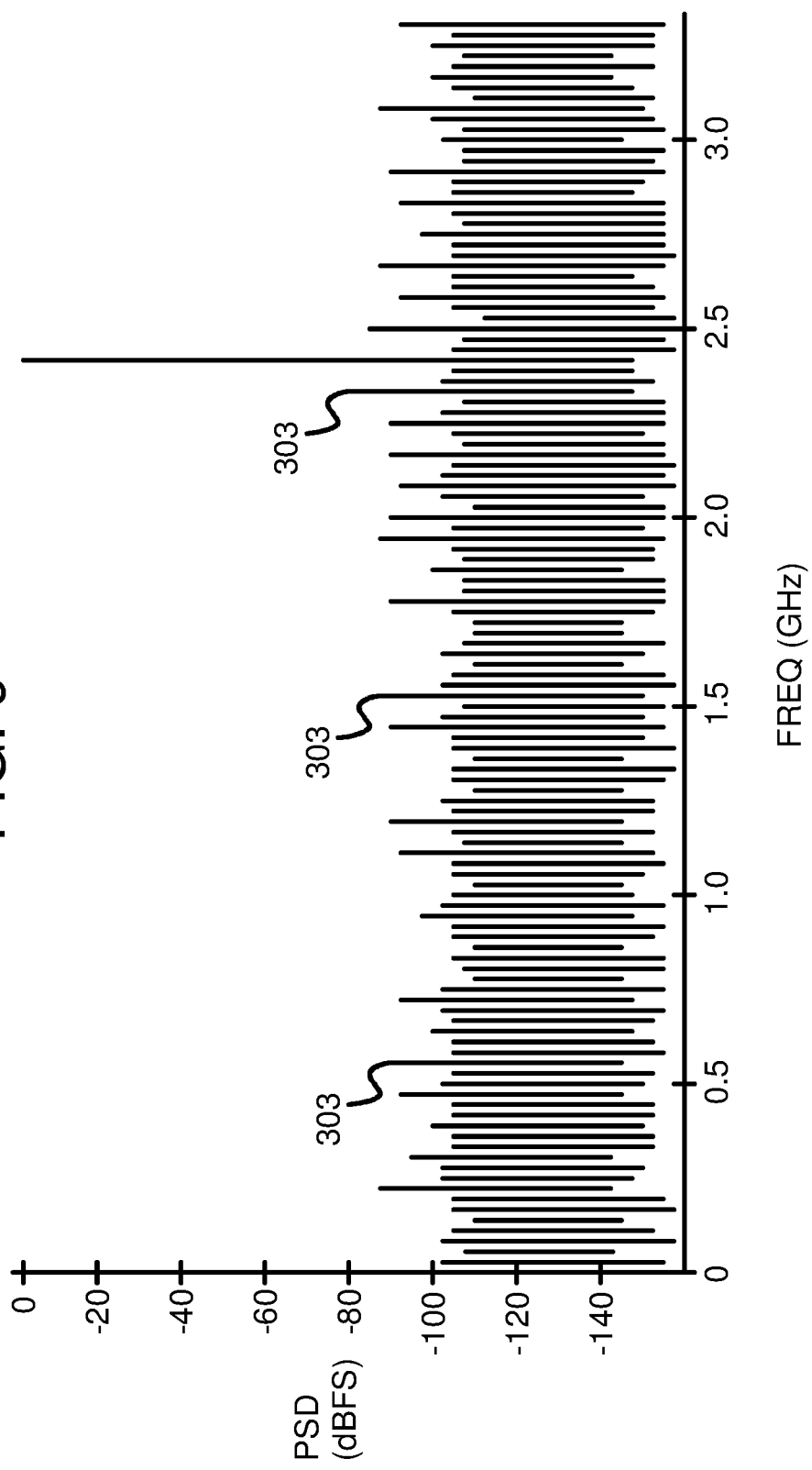

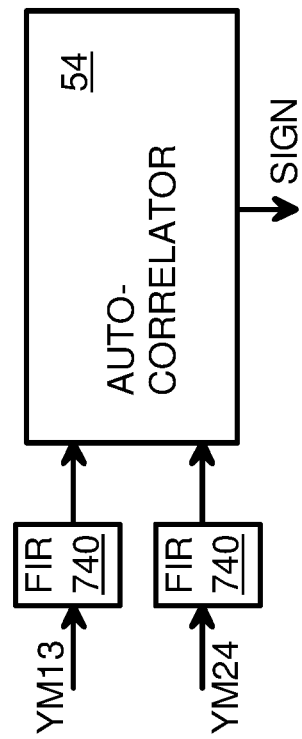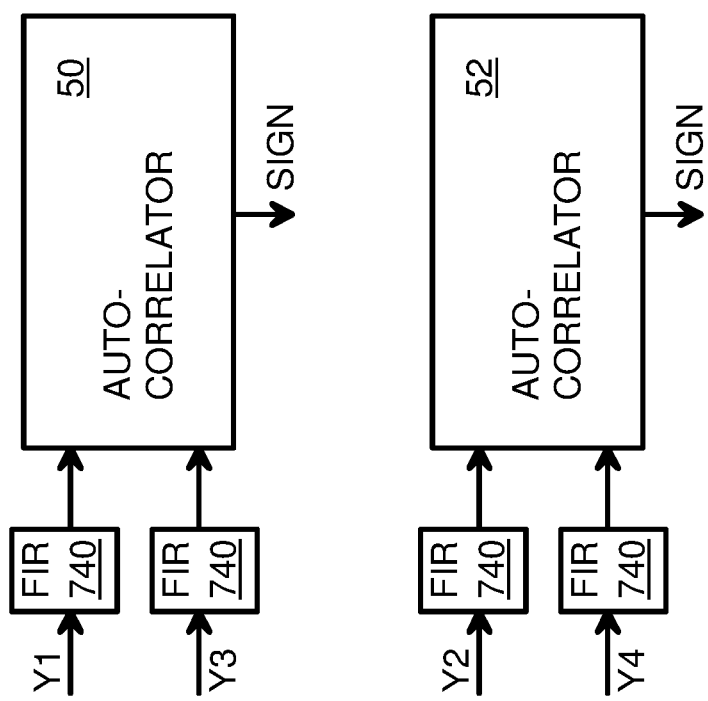
FIG. 16

CALIBRATION OF TIMING SKEWS IN A MULTI-CHANNEL INTERLEAVED ANALOG-TO-DIGITAL CONVERTER (ADC) BY AUTO-CORRELATION OF MUXED-TOGETHER CHANNELS IN BINARY OUTPUT TREE

FIELD OF THE INVENTION

This invention relates to Analog-to-Digital Converters (ADC), and more particularly to calibration of interleaved ADCs.

BACKGROUND OF THE INVENTION

Analog-to-Digital Converters (ADCs) are widely used to convert analog signals to digital values. Multi-bit ADCs have a high resolution, and its accuracy can be improved by calibration. Higher sampling rates can be achieved by interleaving two ADCs that each operate at half the sampling rate.

FIG. 1 shows a prior-art interleaved ADC. ADC 10 and ADC 12 are interleaved, with ADC 10 sampling analog input AIN when clock CLK closes switch 20, and ADC 12 sampling analog input AIN when inverse clock CLKB closes switch 22. Mux 18 selects digital output Y1 from ADC 10 when CLK is high, when ADC 10 has had sufficient time to sample and hold AIN and convert it to a digital value. The digital output DOUT is Y2 when CLK is low to mux 18. Thus each of ADC 10, 12 can operate at half the data rate of the final output DOUT.

FIG. 2 is a graph of analog sampling and clock skew. AIN is sampled into ADC 10 to generate Y1[K−1] and Y1[K] on the falling edges of CLK, while AIN is sampled into ADC 12 to generate Y2[K−1] and Y2[K] on the falling edges of CLKB, where K is the sample or time-index number. The sampling time or period of AIN is Ts. Ideally there is no clock skew in CLK and all samples are separated by Ts. However, CLK may not have a pulse width that is exactly 50% of period 2*Ts, introducing sampling pulse-width mismatch and non-linearities. Sampling of channel Y2 may be delayed relative to sampling of channel Y1 by Ts+ΔT/2, while Sampling of channel Y1 may be delayed relative to sampling of channel Y2 by Ts−ΔT/2. Ideally ΔT=0 without mismatch on sampling. However in reality ΔT is finite. It is desired to reduce ΔT to a minimal acceptable level for more than 2 channels.

ADC 10, 12 and switches 20, 22 may not be exactly matched, introducing finite bandwidth mismatches among the two channels Y1, Y2. Thus both sampling-pulse mismatches and ADC component mismatches may contribute to nonlinearities.

FIG. 3 is a graph of spurious tones in a spectrum for a prior-art interleaved ADC. Sampling pulse-width mismatches and component mismatches may introduce non-linearities or errors that cause spurious tones 302. These spurious tones can occur at integer multiples of Fs/N, K*Fs/N±F, wherein K is an integer, where Fs is the sampling frequency (period Ts=1/Fs) and N is the number of channels interleaved together. These spurious tones are undesirable since they can restrict the dynamic range of high-speed ADCs and are proportional to analog input signal amplitude and frequency.

What is desired is a highly-interleaved ADC with at least 4 ADC channels interleaved together for operation at higher sampling rates. It is desired to introduce a variable, programmable delay to each of the channel inputs to correct for timing skews caused by sampling pulse-width, clock, and component mismatches among the 4 or more channels interleaved together. A calibration method is desired to test various values of these delays to program these delays to minimize the skew among the multiple channels. Both a rapid foreground calibration method and a background calibration method to adjust for gradual temperature skews are desired.

BRIEF DESCRIPTION OF THE DRAWINGS

FIG. 9 is a graph of reduced spurious tones in a spectrum for an interleaved ADC with channel input delays calibrated by auto-correlators.

FIG. 16 shows FIR filtering of ADC outputs.

DETAILED DESCRIPTION

The present invention relates to an improvement in interleaved ADC calibration. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described but is to be accorded the widest scope consistent with the principles and novel features herein disclosed.

Figure 4:
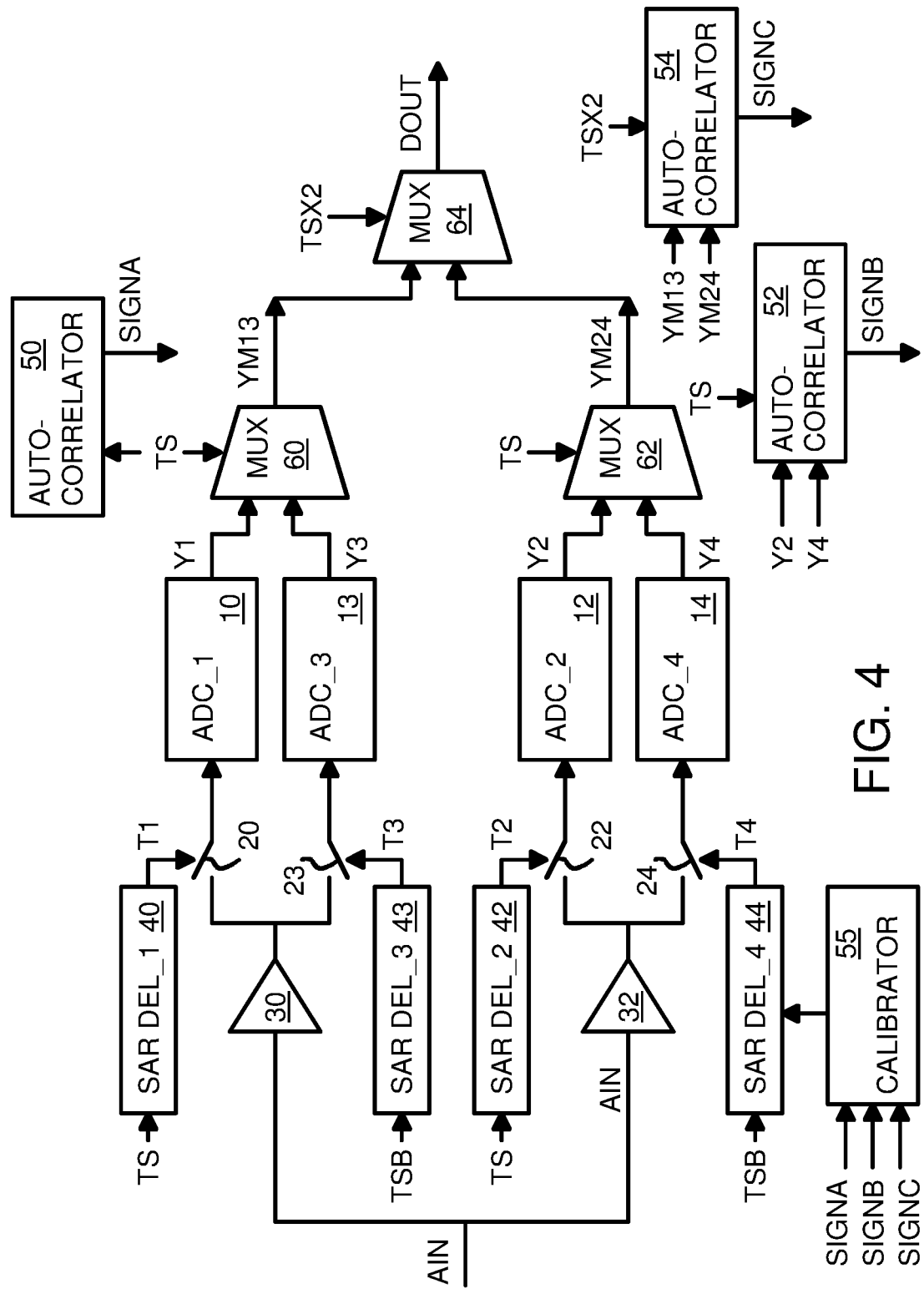
FIG. 4 is a block diagram of a 4-channel interleaved ADC with auto-correlators for calibration of programmable input delays.

FIG. 4 is a block diagram of a 4-channel interleaved ADC with auto-correlators for calibration of programmable input delays. Analog input AIN is buffered by analog buffer 30 and sampled by switch 20 into ADC 10 that generates digital value Y1 and sampled by switch 23 into ADC 13 that generates digital value Y3. Analog input AIN is also buffered by analog buffer 32 and sampled by switch 22 into ADC 12 that generates digital value Y2 and sampled by switch 24 into ADC 14 that generates digital value Y4.

Odd channels Y1, Y3 are muxed together and alternately output to YM13 by mux 60, while even channels Y2, Y4 are muxed together and alternately output to YM24 by mux 62. Final mux 64 alternately selects YM13 and YM24 to generate the final data output DOUT. Final mux 64 operates at double speed with clock TSX2 while muxes 60, 62 receive sampling clock TS.

Sampling clock TS or its inverse TSB is delayed by variable delays to generate clocks T1, T2, T3, T4 that control switches 20, 22, 23, 24, respectively, that sample AIN to ADC 10, 12, 13, 14 that generate channel digital outputs Y1, Y2, Y3, Y3, having phases of 0, 90, 180, and 270 degrees. These variable delays are programmed during calibration with digital values that are stored in a Successive-Approximation-Register (SAR) that enables and disables binary-weighted capacitor delay elements. Calibration uses a Successive-Approximation method testing larger, Most-Significant Bit (MSB) capacitors first, then testing successively smaller capacitors until a Least-Significant Bit (LSB) capacitor is tested.

SAR delay 40 delays sampling clock TS to generate T1 to switch 20, while SAR delay 43 delays inverse sampling clock TSB to generate T3 to switch 23. By adjusting the delay values programmed into SAR delays 40, 43, the timing skews between odd channels Y1, Y3 can be compensated for and matched to within the delay of 1 LSB capacitor in SAR delay 40, 43, using 0-degree and 180-degree clocks for T1 and T3.

Likewise, SAR delay 42 delays sampling clock TS to generate T2 to switch 22, while SAR delay 44 delays inverse sampling clock TSB to generate T4 to switch 24. By adjusting the delay values programmed into SAR delays 42, 44, the timing skews between even channels Y2, Y4 can be compensated for and matched to within the delay of 1 LSB capacitor in SAR delay 42, 44, using 90-degree and 270-degree clocks for T2 and T4.

Auto-correlator 50 compares the digital values Y1, Y3 and generates a sign bit SIGNA of the correlation result. This sign bit indicates whether Y1 or Y2 is larger, allowing the calibration routine to decide whether to set or clear a bit being tested for SAR delay 40 or SAR delay 43.

Auto-correlator 52 compares the digital values Y2, Y4 and generates a sign bit SIGNB of the correlation result. This sign bit indicates whether Y2 or Y4 is larger, allowing the calibration routine to decide whether to set or clear a bit being tested for SAR delay 42 or SAR delay 44.

Auto-correlator 54 compares the muxed digital values YM13, YM24 and generates a sign bit SIGNC of the correlation result. This sign bit indicates whether YM13 or YM24 is larger, allowing the calibration routine to decide whether to set or clear a bit being tested for SAR delay 40, 43 or SAR delay 42, 44. Auto-correlator 54 receives clock TSX2 and operates a double the frequency of auto-correlators 50, 52, which receive clock TS.

Calibrator 55 receives sign bit SIGNA from auto-correlator 50, sign bit SIGNB from auto-correlator 52, and sign bit SIGNC from auto-correlator 54, and uses these sign bits during a successive-approximation sequence to decide when to keep a test bits set in SAR delay 40, 42, 43, 44 and when to reset the test bit, as successively smaller bit-positions are tested. SIGNA is initially used to select one of either SAR delay 40, 41 for adding test bits. SIGNB is initially used to select one of either SAR delay 42, 44 for adding test bits. For level 2, SIGNC is initially used to select both SAR delay 40, 43, or both SAR delay 42, 44, for adding test bits to during the level 2 sequence.

Figure 5:
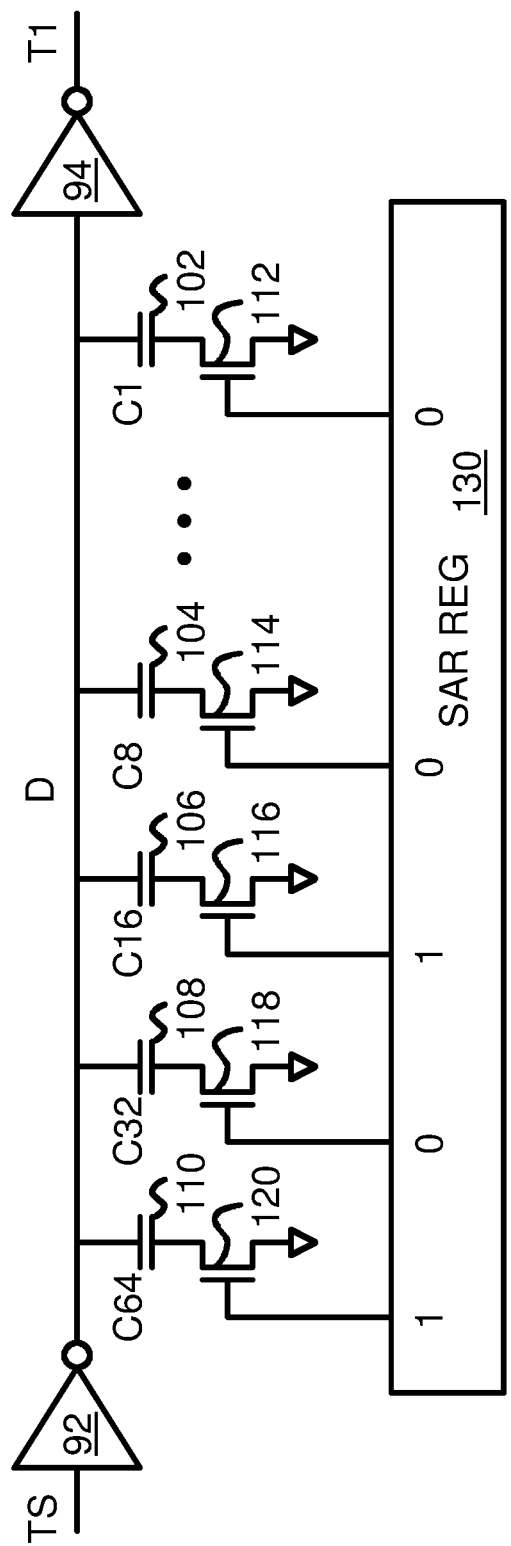
FIG. 5 is a diagram of a SAR delay element with binary-weighted capacitors.

FIG. 5 is a diagram of a SAR delay element with binary-weighted capacitors. SAR delay 40 has input inverter 92 that inverts input sampling clock TS to drive delay node D, and output inverter 94 that drives local sampling clock T1 for channel 1.

A series of binary-weighted capacitors 110, 108, 106, 104, . . . 102 have capacitance values or weights of 64, 32, 16, 8, 4, 2, and 1 times a minimum capacitor value of C, C1 capacitor 102. All of binary-weighted capacitors 110, 108, 106, 104, . . . 102 have one terminal that connects to delay node D between inverters 92, 94, and another terminal connected to ground through enabling transistors 120, 118, 116, 114, . . . 112. Bits in SAR register 130 drive the gates of enabling transistors 120, 118, 116, 114, . . . 112. When the bit in SAR register 130 is high, the enabling transistor is turned on, connecting the lower terminal of the capacitor to ground, enabling the capacitor and increasing the capacitance and delay of delay node D.

For example, the value 1010000 programmed into SAR register 130 enables transistors 120, 116, and capacitors 110, 106, increasing the capacitance on delay node D by 64C+ 16C, or 80C. MSB capacitor 110 adds a 64C delay while capacitor 106 adds a 16C delay. Other SAR delays 42, 43, 44 operate in a similar manner and can each be programmed with a different SAR delay value.

Figure 6:
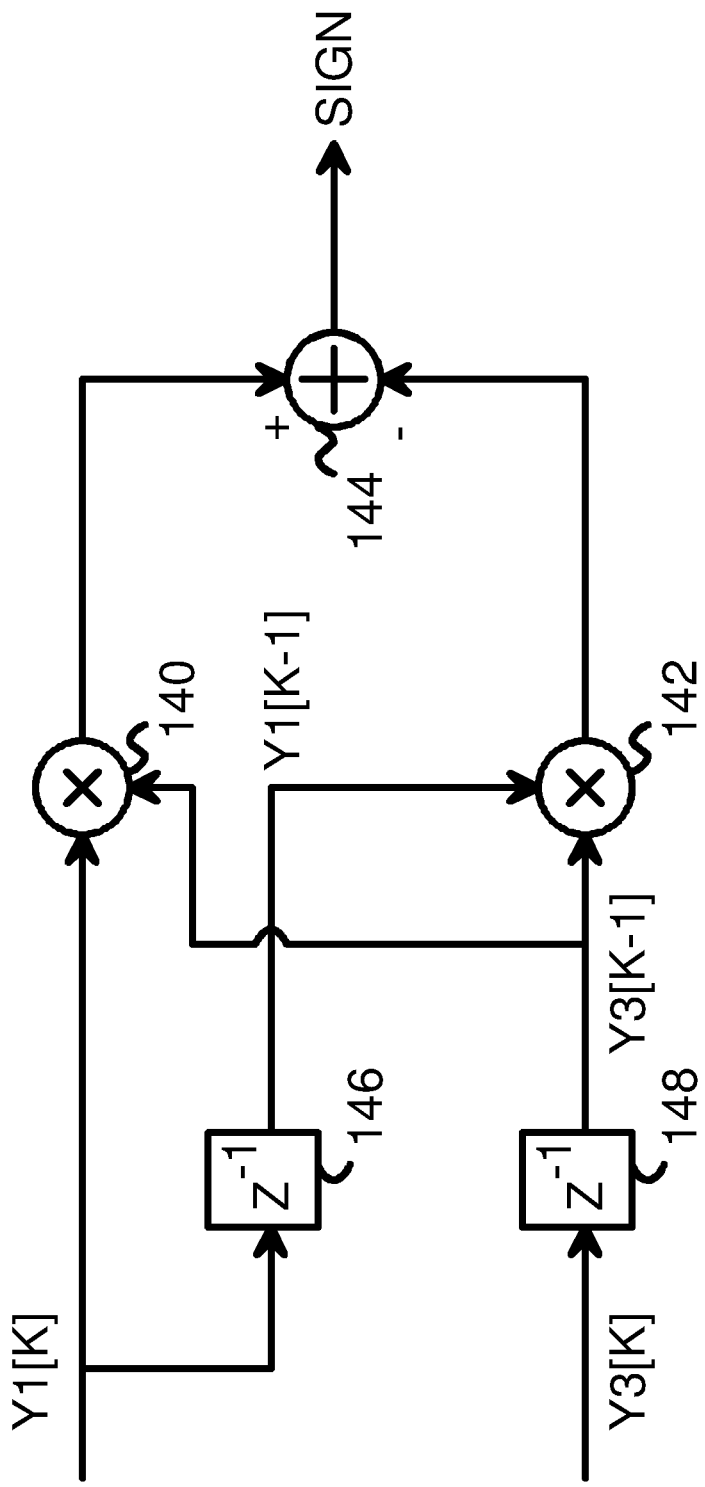
FIG. 6 shows the auto-correlator in more detail.

FIG. 6 shows the auto-correlator in more detail. Auto-correlator 50 receives Y1 from ADC 10 at time K as Y1[K] and receives Y3 from ADC 13 at time K as Y3[K]. Y1[K] is delayed by sample delay 146 to generate Y1[K−1], while Y3[K] is delayed by sample delay 148 to generate Y3[K−1].

Multiplier 140 multiplies Y1[K] with Y3[K−1] while multiplier 142 multiplies Y1[K−1] with Y3[K−1]. Final adder 144 generates the sign bit SIGN of the correlation error Y1[K]*Y3[K−1]−Y1[K−1]*Y3[K−1].

Figure 1:
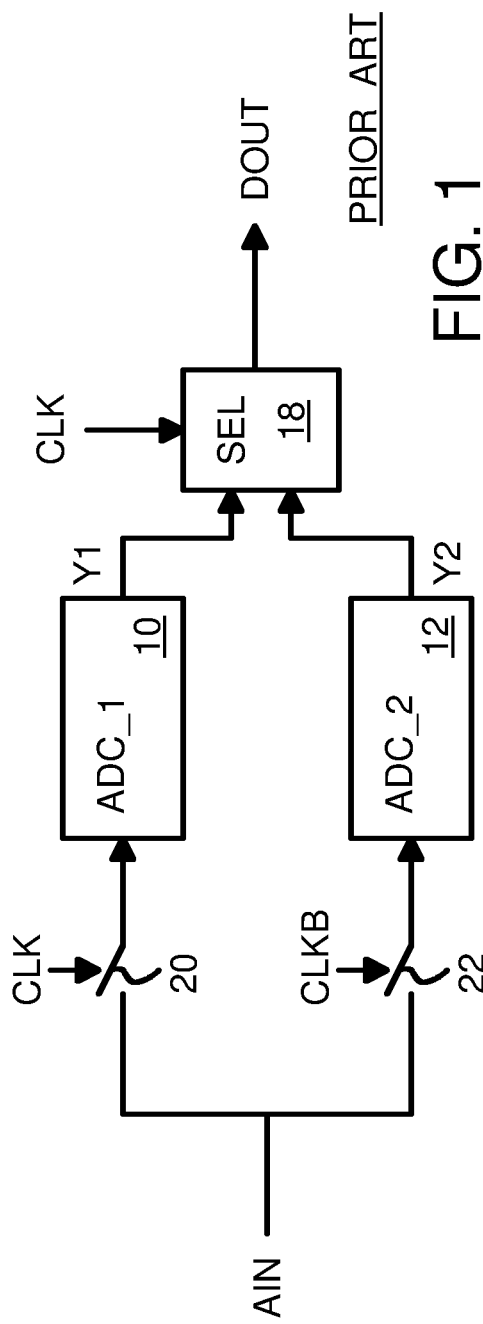
FIG. 1 shows a prior-art interleaved ADC.
Figure 2:
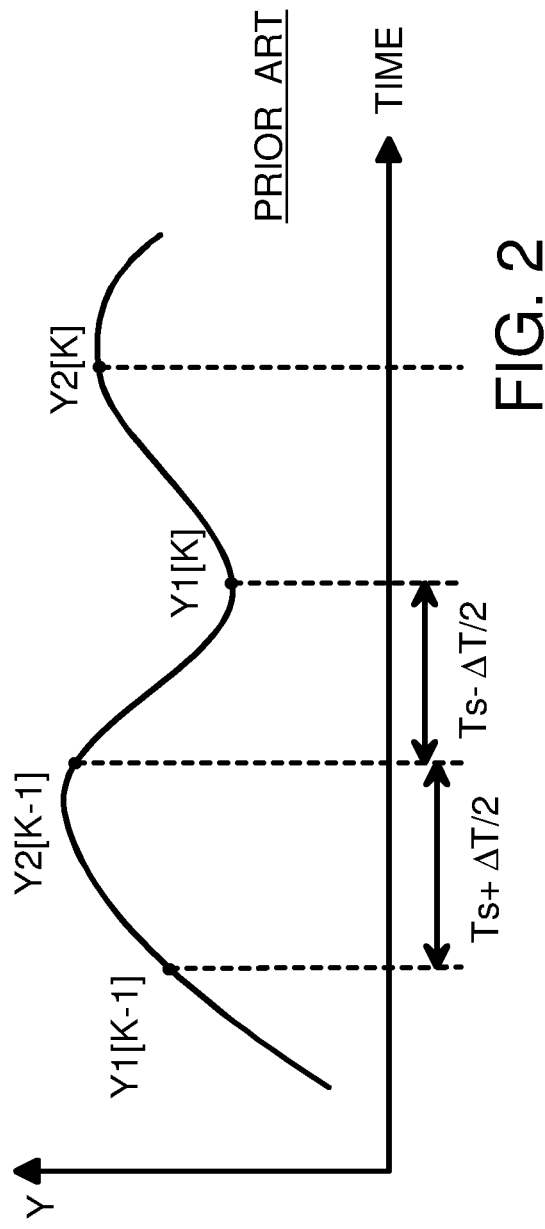
FIG. 2 is a graph of analog sampling and clock skew.

When ΔT is positive (FIG. 2), Y1[K]*Y3[K−1] is smaller than Y1[K−1]*Y3[K−1], so Y1[K]*Y3[K−1]−Y1[K−1]*Y3 [K−1] is negative, and the sign bit is 1. A delay should be added to SAR delay 40 to reduce ΔT. When ΔT is negative, Y1[K]*Y3[K−1] is larger than Y1[K−1]*Y3[K−1], so Y1[K]*Y3[K−1]−Y1[K−1]*Y3[K−1] is positive, and the sign bit is 0. A delay should be added to SAR delay 43 to increase ΔT. Other auto-correlators 52, 54 operate in a similar manner.

Figure 7A:
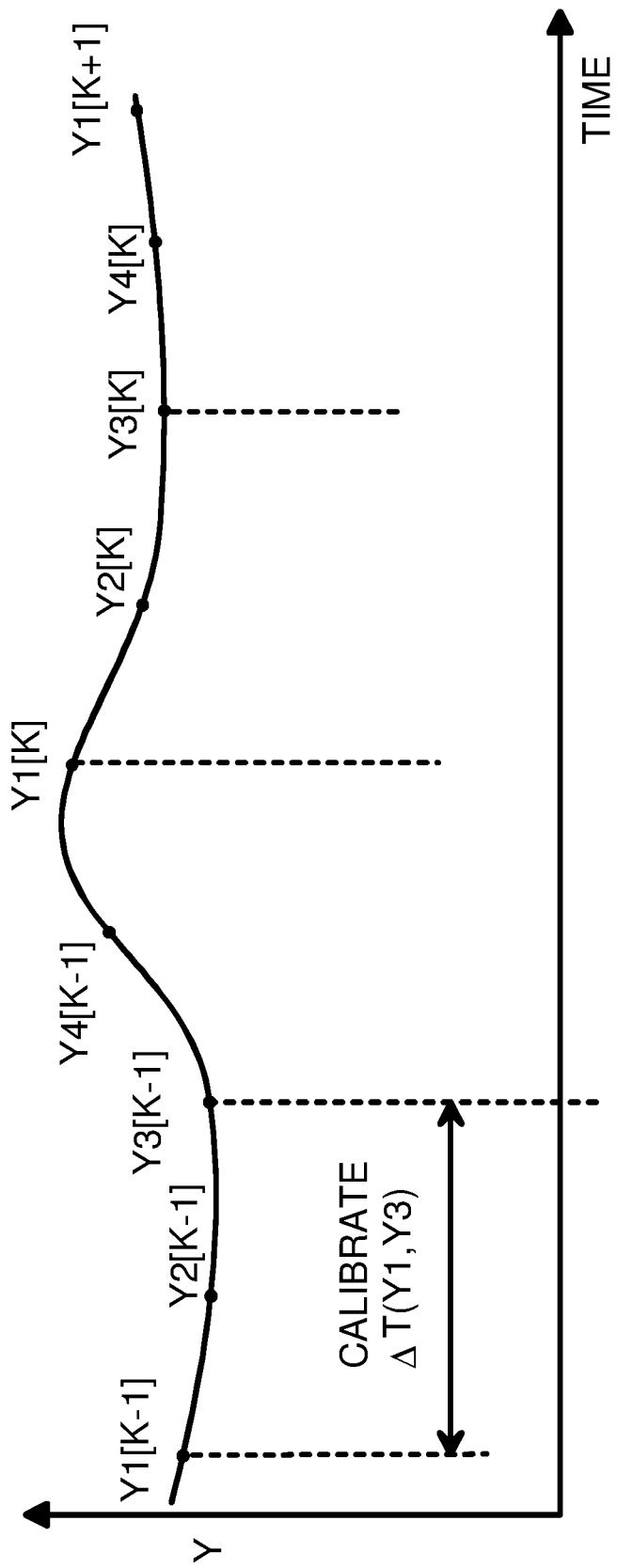
FIGS. 7A-7C highlight sample auto-correlation during calibration.
Figure 7B:
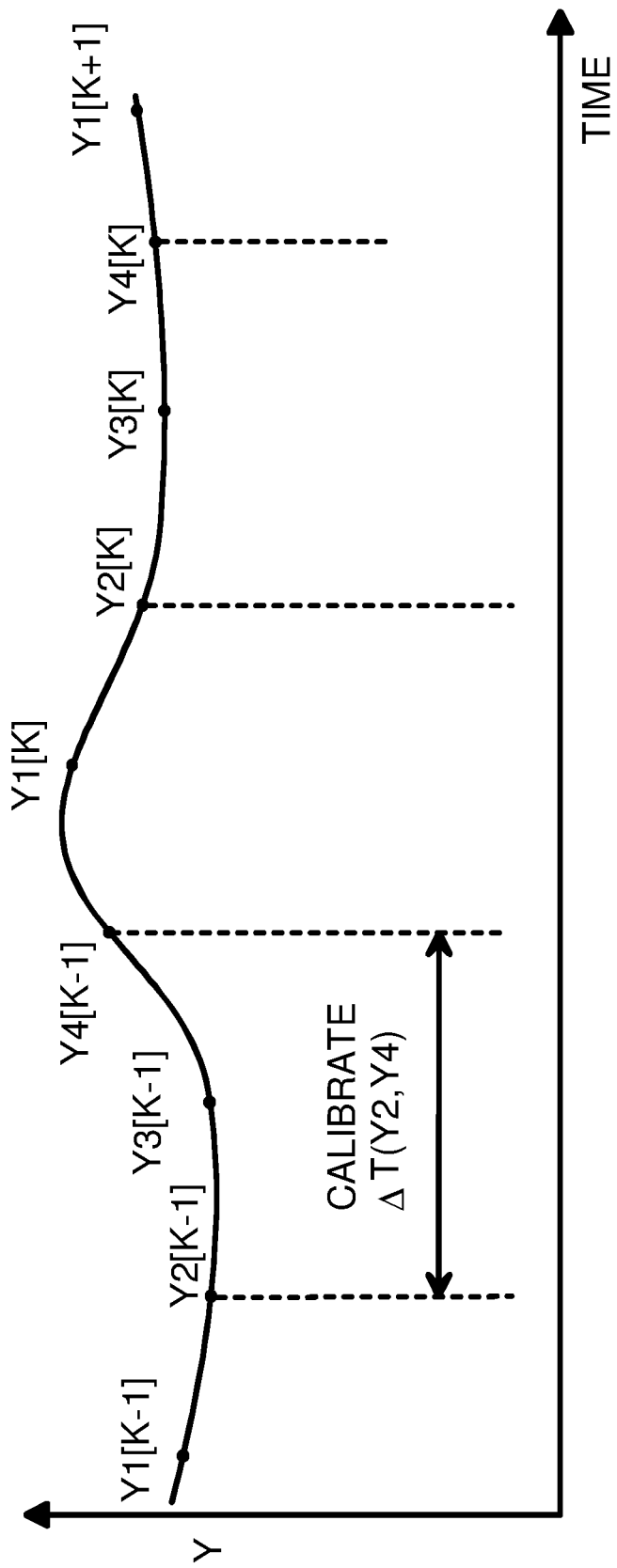
Figure 7C:
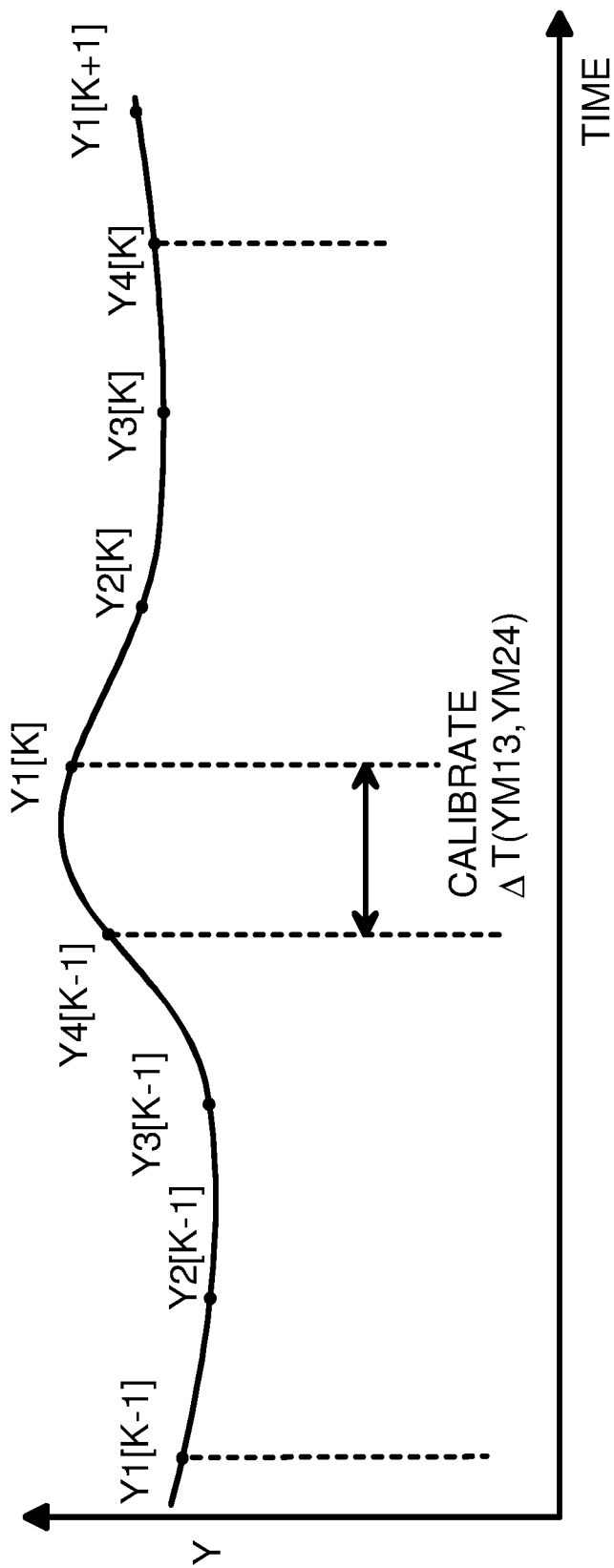

FIGS. 7A-7C highlight sample auto-correlation during calibration. In a first step highlighted by FIG. 7A, auto-correlator 50 compares Y1 and Y3 to generate the sign of Y1[K]*Y3 [K−1]−Y1[K−1]*Y3[K−1]. When ΔT(Y1,Y3) is positive, Y1[K]*Y3[K−1] is smaller than Y1[K−1]*Y3[K− 1], so Y1[K]*Y3[K−1]−Y1[K−1]*Y3[K−1] is negative, and the sign bit is 1. A delay should be added to SAR delay 40 to reduce ΔT(Y1,Y3). When ΔT(Y1,Y3) is negative, Y1[K]* Y3[K−1] is larger than Y1[K−1]*Y3[K−1], so Y1[K]*Y3 [K−1]−Y1[K−1]*Y3[K−1] is positive, and the sign bit is 0. A delay should be added to SAR delay 43 to increase ΔT(Y1,Y3).

In a second step highlighted by FIG. 7B, auto-correlator 52 compares Y2 and Y4 to generate the sign of Y2[K]*Y4 [K−1]−Y2[K−1]*Y4[K−1]. When ΔT(Y2,Y4) is positive, Y2[K]*Y4[K−1] is smaller than Y2[K−1]*Y4[K−1], so Y2[K]*Y4[K−1]−Y2[K−1]*Y4[K−1] is negative, and the sign bit is 1. A delay should be added to SAR delay 42 to reduce ΔT(Y2,Y4). When ΔT(Y2,Y4) is negative, Y2[K] *Y4[K−1] is larger than Y2[K−1]*Y4[K−1], so Y2[K]*Y4 [K−1]−Y2[K−1]*Y4[K−1] is positive, and the sign bit is 0. A delay should be added to SAR delay 44 to increase ΔT(Y2,Y4).

In a final third step highlighted by FIG. 7B, auto-correlator 54 compares Y1 and Y3 muxed together as YM13, and Y2 and Y4 muxed together as YM24, to generate the sign of YM12[K]*YM24[K−1]−YM13[K−1]*YM24[K−1]. When ΔT(YM13,YM24) is positive, YM13[K]*YM24[K−1] is smaller than YM13[K−1]*YM24[K−1], so YM13[K]*YM24[K−1]−YM13[K−1]*YM24[K−1] is negative, and the sign bit is 1. A delay should be added to both SAR delay 40 and SAR delay 43 to reduce ΔT(YM13,YM24). When ΔT(YM13,YM24) is negative, YM13[K]*YM24[K−1] is larger than YM13[K−1]*YM24[K−1], so YM13[K]*YM24[K−1]−YM13[K−1]*YM24[K−1] is positive, and the sign bit is 0. A delay should be added to both SAR delay 42 and SAR delay 44 to increase ΔT(YM13,YM24).

FIGS. 8A-8D is a flowchart of foreground calibration of 4 ADC channels interleaved together. This process can be used to initially calibrate the 4-way interleaved ADC of FIG. 4. The odd pair of channels Y1 and Y3 are calibrated in a first pass through FIGS. 8A-8B using auto-correlator 50, then starting in step 236 the even pair of channels Y2, Y4 are calibrated in a second pass through steps 204-232 of FIGS. 8A-8B using auto-correlator 52. This is called level 1, where each adjacent pair of ADC outputs are correlated. Finally in FIGS. 8C-8D the muxed outputs YM13, YM24 are calibrated using auto-correlator 54 for level 2.

Figure 8A:
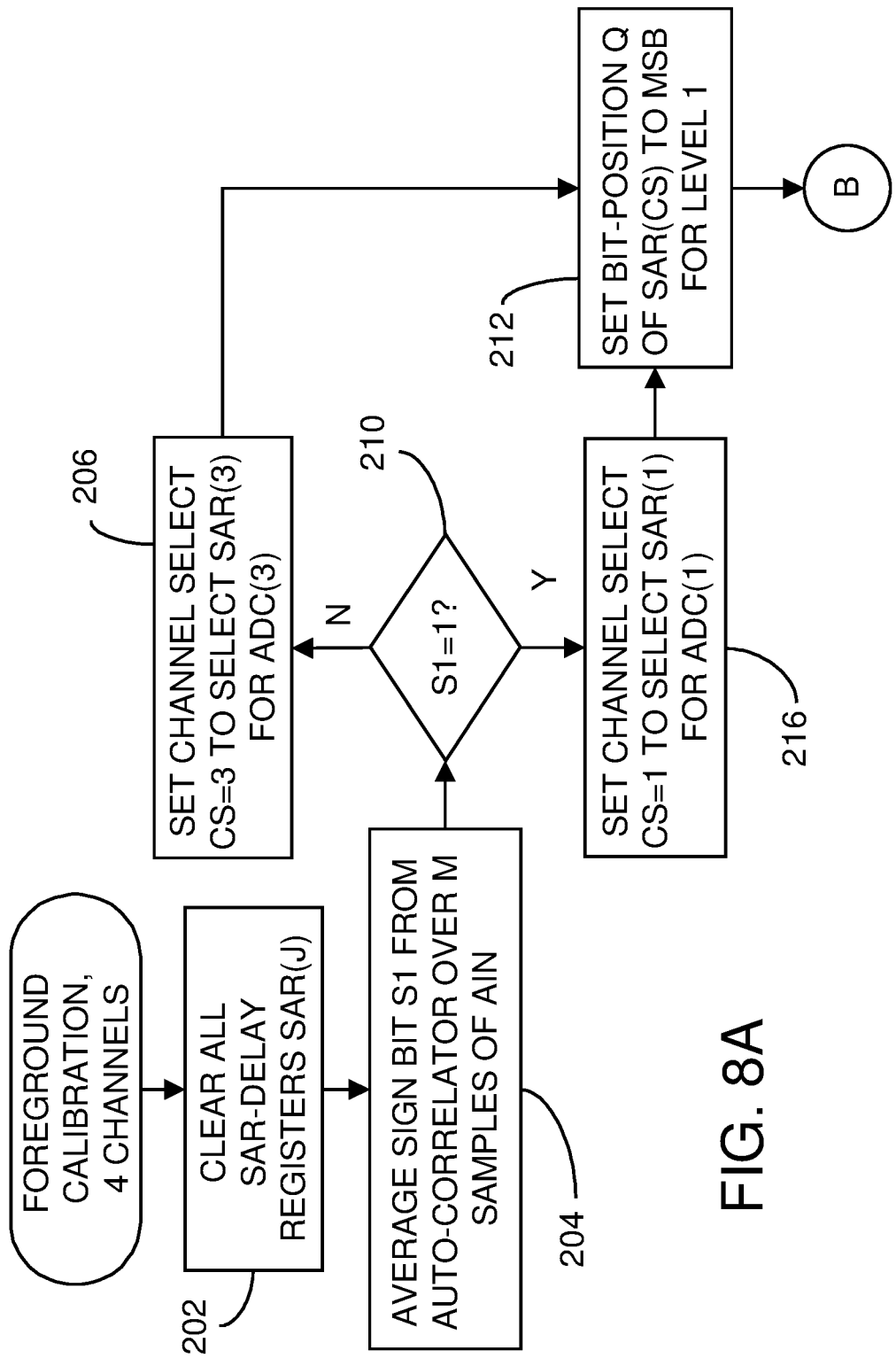
FIGS. 8A-8D is a flowchart of foreground calibration of 4 ADC channels interleaved together.

In FIG. 8A, all bits in all of SAR delay 40, 42, 42, 44 are cleared, step 202. This disconnects all binary-weighted capacitors 110, 108, 106, 104, . . . 102 for all of the SAR delay elements. The sign bit SIGN from auto-correlator 50 is averaged as S1 over M samples of analog input AIN, step 204. M can be a large number of samples, such as 2^22, that can still be collected in a short time at high-frequency operation.

When the averaged sign bit S1 is 1, step 210, Y1[K]*Y3[K−1]−Y1[K−1]*Y3[K−1] was negative on average over the M samples. The sign is for a negative number, so ΔT(Y1,Y3) is positive. On average, Y1[K]*Y3[K−1] is smaller than Y1[K−1]*Y3[K−1]. A delay should be added to SAR delay 40 to decrease ΔT(Y1,Y3). The channel select CS is set to 1, step 216.

When the averaged sign bit S1 is 0, step 210, Y1[K]*Y3[K−1]−Y1[K−1]*Y3[K−1] was positive on average over the M samples. The sign is for a positive number, so ΔT(Y1,Y3) is negative. On average, Y1[K]*Y3[K−1] is larger than Y1[K−1]*Y3[K−1]. A delay should be added to SAR delay 43 to increase ΔT(Y1,Y3). The channel select CS is set to 3, step 206.

The bit-position Q is set to the MSB for this level 1, step 212. Q is the bit-position in either SAR delay 40, when CS=1, or in SAR delay 43, when CS=3. This MSB for level 1 can be less than the overall MSB for SAR delay 40 to allow for overflows on higher levels. For example, the MSB for level 2 could be Q=6 to correspond to C64 binary-weighted capacitor 110 (FIG. 5) while the MSB for level 1 could be Q=5 to correspond to C32 binary-weighted capacitor 108 (FIG. 5).

Figure 8B:
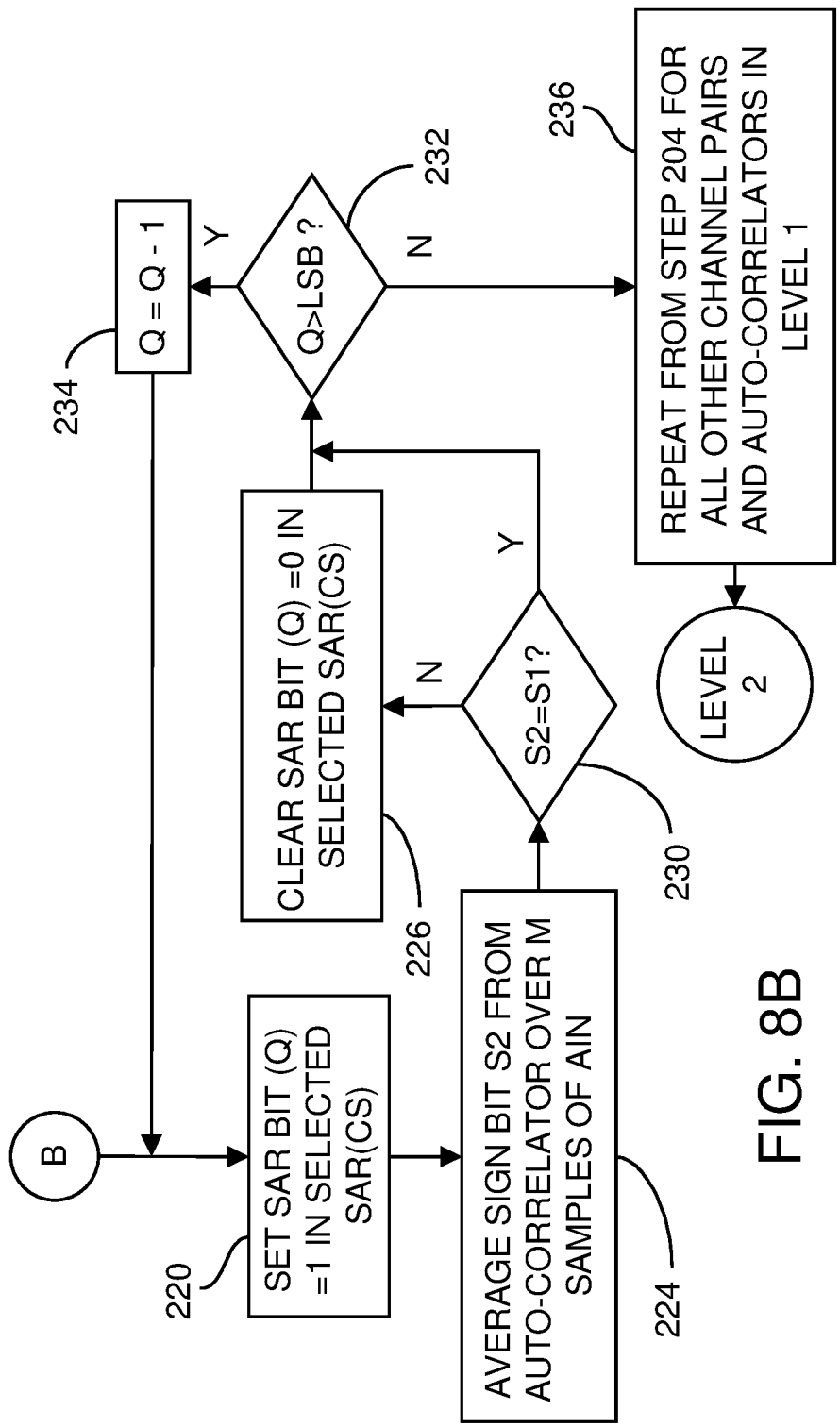

In FIG. 8B, the bit for current bit-position Q is set high in the selected SAR delay element, step 220. For the initial Q=MSB=5 iteration, when cs=1, SAR delay 40 is set to 0100000 while SAR delay 43 remains at 0000000. When cs=3, SAR delay 43 is set to 0100000 while SAR delay 40 remains at 0000000. The selected delay element is SAR delay 40 when cs=1, or SAR delay 43 when cs=3.

The sign bit SIGN from auto-correlator 50 is averaged as S2 over M samples of analog input AIN, step 224. When the averaged sign bit S2 is the same as S1, step 230, the extra capacitance added in step 220 was not sufficient to change the sign of the correlated error and the polarity of ΔT. The extra capacitance and delay added in step 220 should remain enabled during further testing.

When the averaged sign bit S2 is the opposite of S1, step 230, the extra capacitance added in step 220 was too much. The added capacitance and delay changed the sign of the correlated error and the polarity of ΔT. The extra capacitance and delay that was added in step 220 is removed by clearing the added bit Q in either SAR delay 40 (cs=1) or SAR delay 43 (cs=3), step 226. Step 226 is an undo of step 220.

When Q has not yet reached the LSB, step 232, then Q is decremented, step 234, and the next significant bit Q in SAR delay 40 (cs=1) or SAR delay 43 (cs=3) is set, step 220. A new sign bit S2 is averaged with the new setting of SAR delay 40 or SAR delay 43, step 224, and the added bit is cleared when S2 is not equal to the original sign bit S1, steps 230, 226.

This process repeats for successively smaller Q bit-positions and smaller added capacitances in steps 220-234 until Q reaches the LSB, step 232. Then the process is repeated from step 204 for any other channel pairs, such as Y2, Y4, where step 216 is modified to set cs=2 to set and clear bits in SAR delay 42, while step 206 is modified to set cs=4 to set and clear bits in SAR delay 44. The sign bits S1 and S2 are averaged from auto-correlator 52 when processing Y2, Y4, rather than from auto-correlator 50.

Figure 8C:
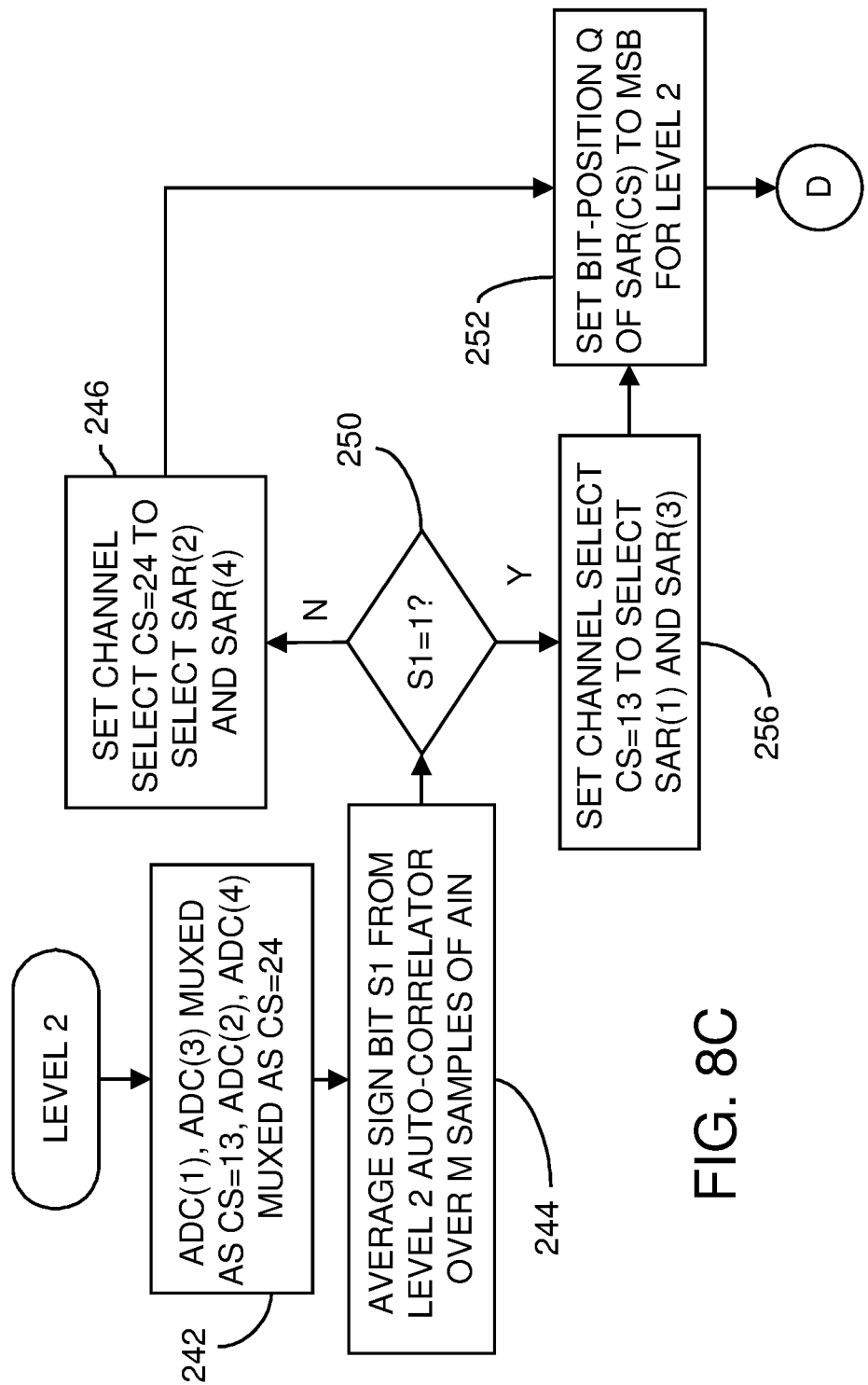

Once all adjacent pairs of channels in level 1 have been processed, step 236, then calibration continues for level 2, FIG. 8C. The values set in SAR delay 40, 42, 43, 44 in FIG. 8A-8B introduce input delays to the sampling clocks on the inputs of ADC 10, 12, 13, 14 to compensate for skews within each of the pairs, to within the LSB capacitor delay. In FIG. 8B-8C, the pair-to-pair skew between the odd pair of Y1, Y3, and the even pair of Y2, Y4, is tested and compensated for.

The output of ADC 10, Y1, and ADC 13, Y3, are muxed together by mux 60 to form YM13 and identified by channel select cs=13. Likewise, the output of ADC 12, Y2, and ADC 14, Y4, are muxed together by mux 62 to form YM24 and identified by channel select cs=24, step 242.

In FIG. 8C, the sign bit SIGN from level-2 auto-correlator 54 is averaged as S1 over M samples of analog input AIN, step 244. When the averaged sign bit S1 is 1, step 250, YM13[K]*YM24[K−1]−YM13[K−1]*YM24[K−1] was negative on average over the M samples. The sign is for a negative number, so ΔT(YM13,YM24) is positive. A delay should be added to both of SAR delay 40 and SAR delay 43 to decrease ΔT(YM13,YM24). The channel select CS is set to 13, step 256.

When the averaged sign bit S1 is 0, step 250, YM13[K]*YM24[K−1]−YM13[K−1]*YM24[K−1] was positive on average over the M samples. The sign is for a positive number, so ΔT(YM13,YM24) is negative. A delay should be added to both of SAR delay 42 and SAR delay 44 to increase ΔT(YM13,YM24). The channel select CS is set to 24, step 246.

The bit-position Q is set to the MSB for this level 2, step 252. Q is the bit-position in both of SAR delay 40, 43, when CS=13, or in both of SAR delay 42, 44, when CS=24. This MSB for level 2 can be larger than the MSB for level 1. For example, the MSB for level 2 could be Q=6 to correspond to C64 binary-weighted capacitor 110 (FIG. 5) while the MSB for level 1 could be Q=5 to correspond to C32 binary-weighted capacitor 108 (FIG. 5).

Figure 8D:
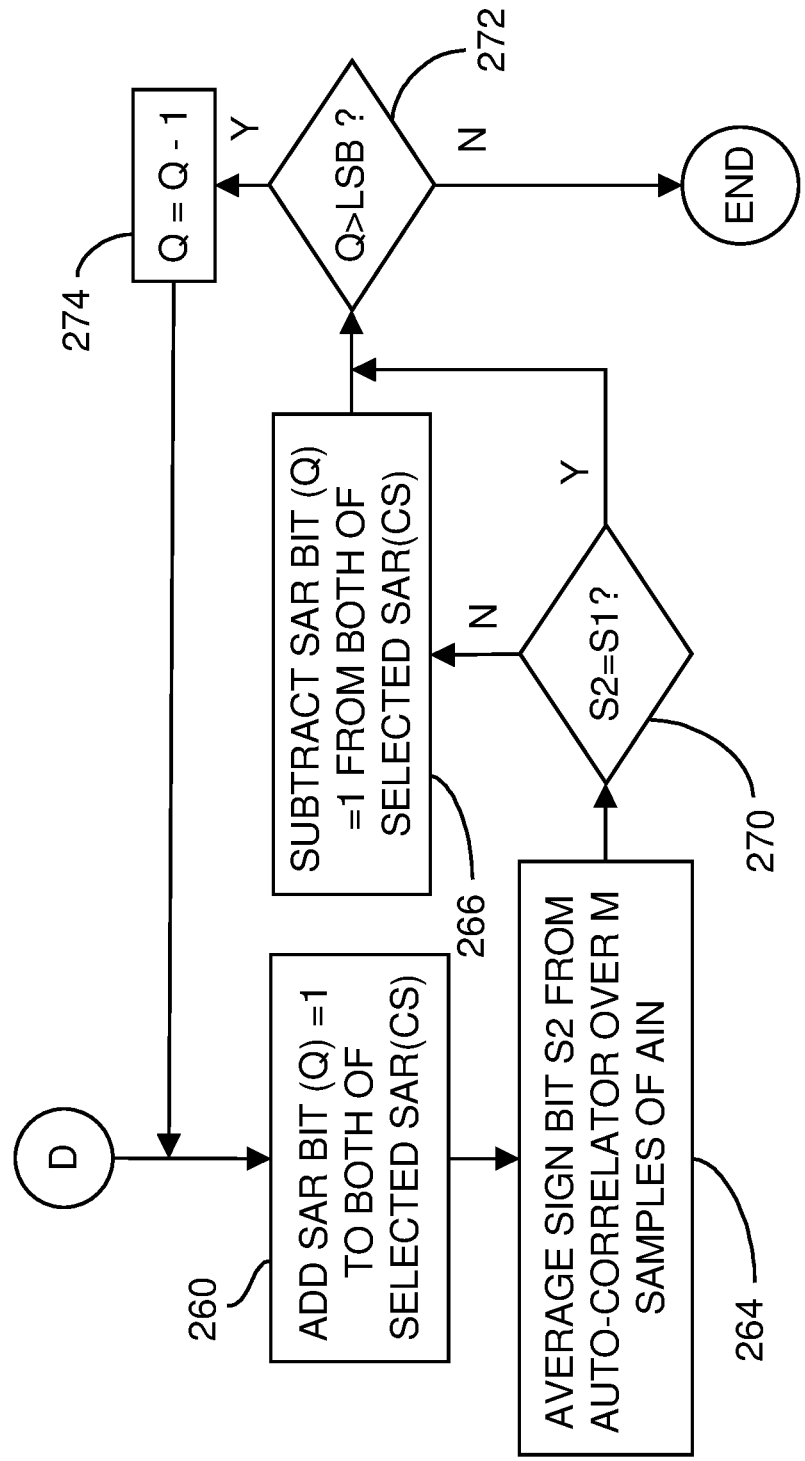

In FIG. 8D, the bit for current bit-position Q is set high and added to the existing values in both of the selected SAR delay elements, step 260. For example, for the initial Q=MSB=6 iteration, when CS=13, when SAR delay 40 was 0010101 and SAR delay 43 was 0000000, adding Q=6 results 1010101 in SAR delay 40 and 1000000SAR delay 43.

The sign bit SIGN from auto-correlator 54 is averaged as S2 over M samples of analog input AIN, step 264. When the averaged sign bit S2 is the same as S1, step 270, then the extra added capacitance added in step 260 was not sufficient to change the sign of the correlated error and the polarity of ΔT. The extra capacitance and delay added in step 260 should remain enabled during further testing.

When the averaged sign bit S2 is the opposite of S1, step 270, the extra capacitance added in step 260 was too much. The added capacitance and delay changed the sign of the correlated error and the polarity of ΔT. The extra capacitance and delay that was added in step 260 is removed by subtracting the added bit Q in either both of SAR delay 40, 43 (CS=13) or both of SAR delay 42, 44 (CS=24), step 266. Step 266 is an undo of step 260.

When Q has not yet reached the LSB, step 272, then Q is decremented, step 274, and the next significant bit Q in SAR delay 40, 43 (CS=13) or SAR delay 42, 44 (CS=24) is added, step 260. A new sign bit S2 is averaged with the new setting of SAR delay 40, 43 or SAR delay 42, 44, step 264, and the added bit is subtracted when S2 is not equal to the original sign bit S1, steps 270, 266.

This process repeats for successively smaller Q bit-positions and smaller added capacitances in steps 260-274 until Q reaches the LSB, step 272, when calibration ends.

Figure 3:
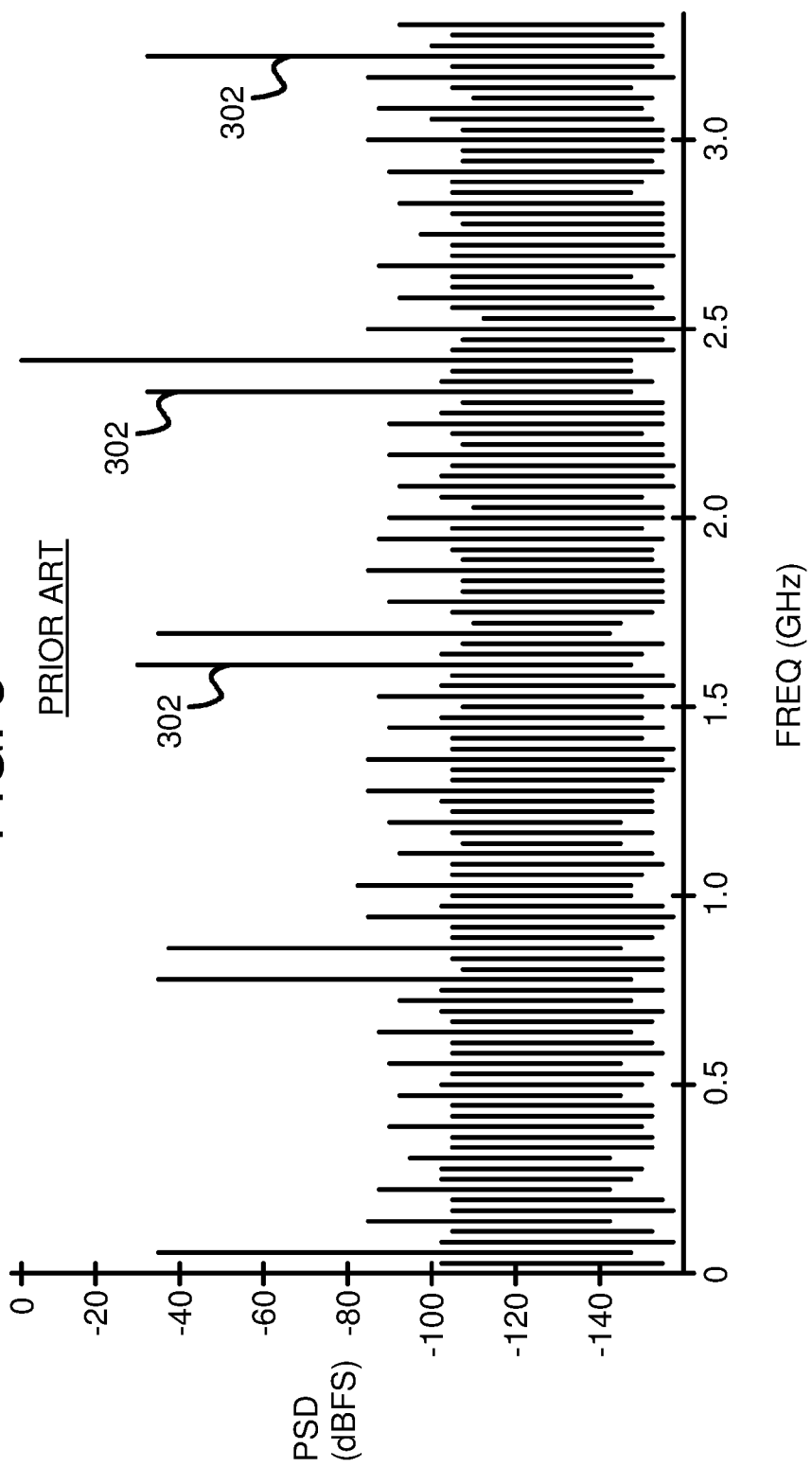
FIG. 3 is a graph of spurious tones in a spectrum for a prior-art interleaved ADC.

FIG. 9 is a graph of reduced spurious tones in a spectrum for an interleaved ADC with channel input delays calibrated by auto-correlators. Sampling pulse-width mismatches and component mismatches that introduce non-linearities or errors are compensated for by the calibration routine of FIGS. 8A-8D adjusting the programmable delays in SAR delay 40, 42, 43, 44 in the interleaved ADC shown in FIG. 4. This calibration reduces the amplitude of spurious tones 303. These spurious tones still occur at integer multiples of Fs/N, K*Fs/N±Fin, where Fs is the sampling frequency (period Ts=1/Fs) and N is the number of channels interleaved together. However, the amplitude of spurious tones 303 are reduced when compared with spurious tones 302 of the prior-art of FIG. 3.

Figure 10:
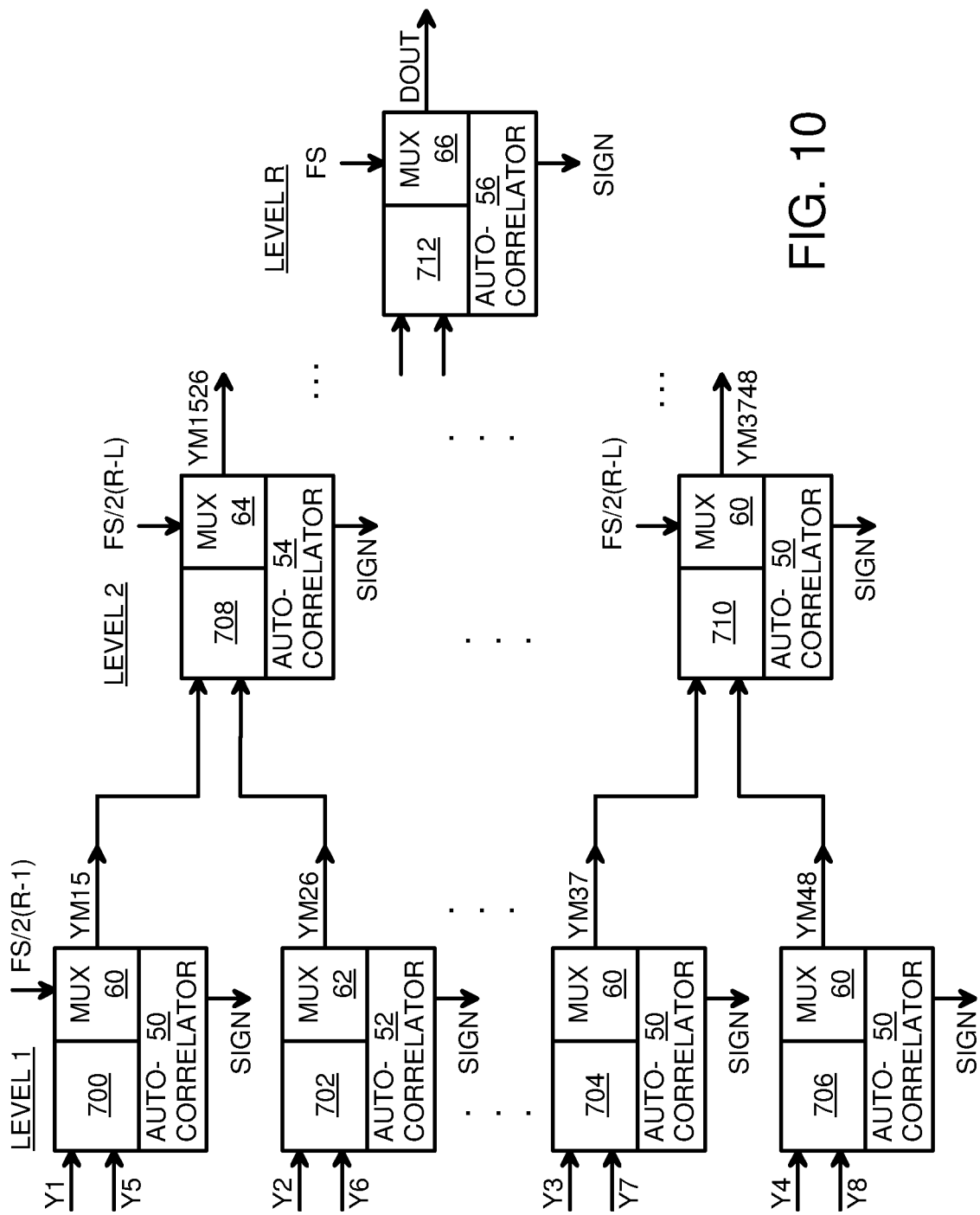
FIG. 10 shows a binary tree of auto-correlators and muxing on the outputs of interleaved

FIG. 10 shows a binary tree of auto-correlators and muxing on the outputs of interleaved ADCs. Auto-correlator 50, 52, 54, 56 can be arranged into a binary tree that matches the binary tree of muxes 60, 62, 64, 66 that mux the outputs Y1, Y2, . . . Y(N) of the interleaved ADCs on a first-level of the binary tree. Each channel-pair has one of mux-correlator 700, 702, 704, 706 in level 1 that receives two digital inputs from two ADCs. For example, mux-correlator 700 receives Y1 from ADC 10 (FIG. 4) and Y5 from ADC5 which are both input to mux 60 and auto-correlator 50 for mux-correlator 700. Mux 60 generates mux output YM15 while auto-correlator 50 generates the correlation sign SIGN.

When there are N ADC channels, and N is a binary whole number, level 1 has N/2 mux-correlators 700, 702, 704, 706, while level 2 has N/4 mux-correlators 708, 710, and level 3 has N/8 mux-correlators 700, and the final level R has just one mux-correlator 712 that generates the final data output DOUT form its mux 66. This final mux 66 and final auto-correlator 56 operate at the highest sampling frequency Fs. Lower levels L in the binary tree operate at lower frequencies of Fs/(2*(R−1), where L is the current level, R is the total number of levels which is $\log_2(N)$ for a full binary tree, and both L and R are whole numbers. The muxing and correlation frequency is doubled for each successive level in the binary tree.

Figure 11A:
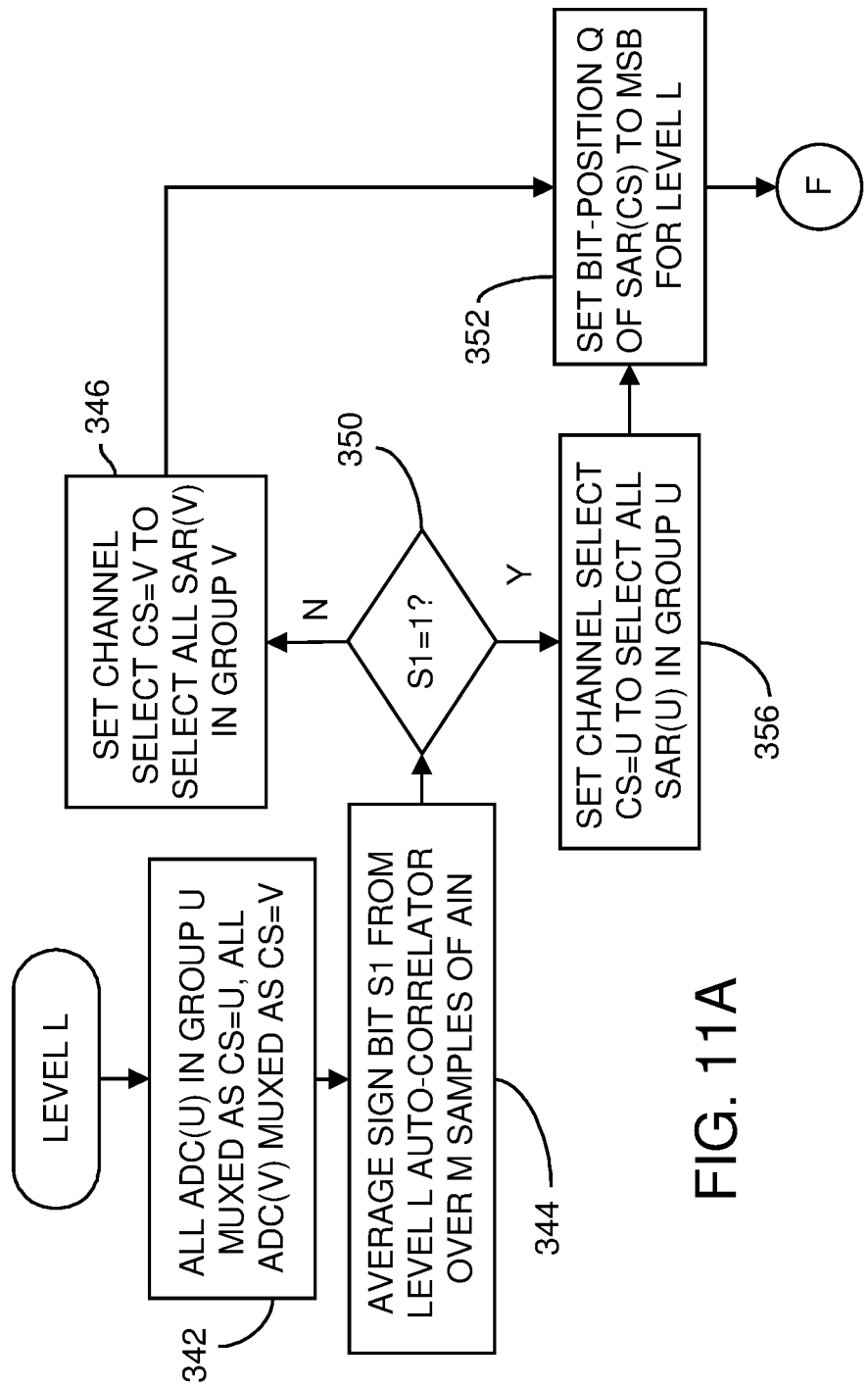
FIGS. 11A-11B show a flowchart of a calibration routine for an arbitrary level in a binary-tree of auto-correlators. ADCs.
Figure 11B:
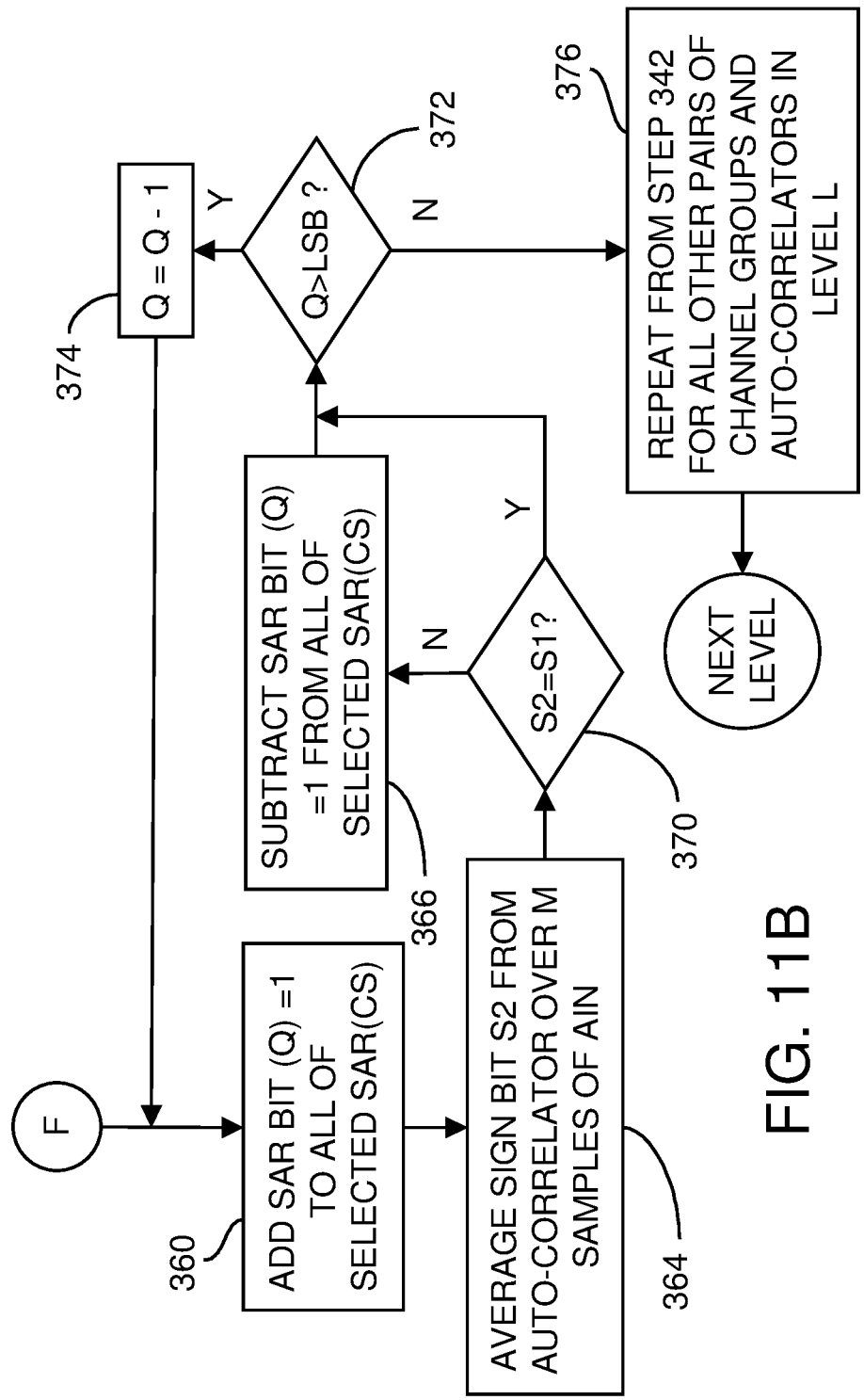

FIGS. 11A-11B show a flowchart of a calibration routine for an arbitrary level in a binary-tree of auto-correlators. For any arbitrary level L in a binary tree, such as shown in FIG. 10, each auto-correlator at level L>1 has two inputs YM(U) and YM(V) from the prior stage's muxes. In first level L=1 each auto-correlator has two inputs Y(U) and Y(V) directly from the ADCs.

All ADC channels Y(Ui) that feed into the muxing that result in YM(U) are in group U, while all ADC channels Y(Vi) that feed into the muxing that result in YM(V) are in group V. Level L may have several auto-correlators, each with a different set of channels in its group U and another set of channels in its group V. Channels in group U are identified by channel select CS=U, and have their ADC outputs muxed together as a first input to the group-pair's auto-correlator, while channels in group V are identified as CS=V, and have their ADC outputs muxed together as the second input of the auto-correlator, step 342.

In FIG. 11A, the sign bit SIGN from level-R auto-correlator for the group-pair UV is averaged as S1 over M samples of analog input AIN, step 344. When the averaged sign bit S1 is 1, step 350, YM(U)[K]*YM(V)[K−1]−YM(U)[K−1]*YM(V)[K−1] was negative on average over the M samples. The sign is for a negative number, so ΔT(YM(U),YM(V)) is positive. A delay should be added to every SAR delay element (SAR delay 40, etc.) SAR(U) in every channel in group U to decrease ΔT(YM(U),YM(V)). The channel select CS is set to U, step 356.

When the averaged sign bit S1 is 0, step 350, YM(U)[K]*YM(V)[K−1]−YM(U)[K−1]*YM(V)[K−1] was positive on average over the M samples. The sign is for a positive number, so ΔT(YM(U),YM(V)) is negative. A delay should be added to every SAR delay SAR(V) in every channel in group V to increase ΔT(YM(U),YM(V)). The channel select CS is set to V, step 346.

The bit-position Q is set to the MSB for this level L, step 352. Q is the bit-position in every SAR(U) when CS=U, or in every SAR(V) when CS=V. This MSB for level L can be larger than the MSB for level 1.

In FIG. 11B, the bit for current bit-position Q is set high and added to the existing values in every SAR delay SAR(CS) for every channel in selected group U or V, step 360. The sign bit SIGN from the current auto-correlator is averaged as S2 over M samples of analog input AIN, step 364. When the averaged sign bit S2 is the same as S1, step 370, then the extra added capacitance added in step 360 was not sufficient to change the sign of the correlated error and the polarity of ΔT. The extra capacitance and delay added in step 360 should remain enabled during further testing.

When the averaged sign bit S2 is the opposite of S1, step 370, the extra capacitance added in step 360 was too much. The added capacitance and delay changed the sign of the correlated error and the polarity of ΔT. The extra capacitance and delay that was added in step 360 is removed by subtracting the added bit Q in all SAR(CS) for the selected channel group U or V, step 366. Step 366 is an undo of step 360.

When Q has not yet reached the LSB, step 372, then Q is decremented, step 374, and the next significant bit Q in all SAR(CS) in selected channel CS, either U or V, is added, step 360. A new sign bit S2 is averaged with the new setting of SAR(CS), step 364, and the added bit is subtracted when S2 is not equal to the original sign bit S1, steps 370, 366.

This process repeats for successively smaller Q bit-positions and smaller added capacitances in steps 360-374 until Q reaches the LSB, step 372. Then the process repeats from step 342 for any other group-pair U, V, step 376. One all possible group-pairs U, V in level L are processed, then next level L+1 in the binary tree of auto-correlators can be processed by repeating from step 342 for level L=L+1. The final level L has only one group-pair and one auto-correlator.

Figure 12:
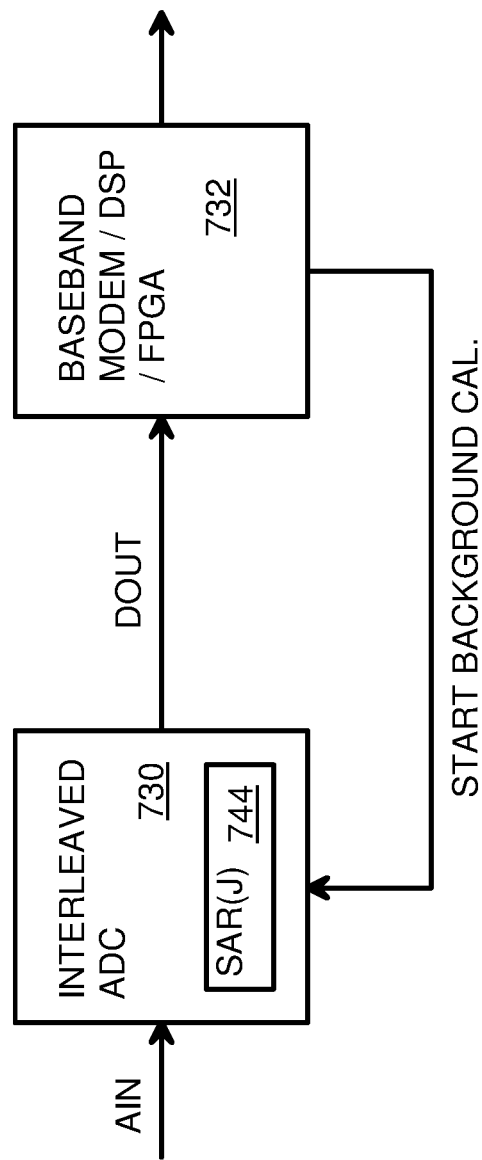
FIG. 12 shows a backend processor triggering background calibration of an interleaved ADC.

FIG. 12 shows a backend processor triggering background calibration of an interleaved ADC. Foreground calibration, such as shown in FIGS. 8A-8D, can be triggered on power-up, initialization, or a reset. This foreground calibration uses auto-correlators to perform Successive-Approximation searches that load delay values into SAR delay registers 744 in interleaved ADC 730 to compensate for timing skews among ADC channels in interleaved ADC 730.

Temperature and voltage conditions can drift over time. Switches, delays, ADCs, and other components and their errors can be temperature and voltage dependent. The circuitry in interleaved ADC 730 is sensitive to temperature and voltage. Over time, as the system heats up or as the environment changes, temperature and supply-voltage changes may cause increased timing skews in interleaved ADC 730. As conditions drift, the calibrated delays may need to be updated to compensate for this drift. Background calibration can be triggered periodically to compensate for these drifts.

Downstream device 732 could be a baseband modem, a Digital Signal Processor (DSP), a Field-Programmable Logic Array (FPGA), or other device that uses the digital output DOUT from interleaved ADC 730. Downstream device 732 may include logic that detects when temperature, voltage, or other conditions have changed and trigger interleaved ADC 730 to perform background calibration. Downstream device 732 could have a timer and trigger background calibration after some period of time, such as hourly or daily. Downstream device 732 could detect idle times or times when the analog input AIN has a suitable signal strength and frequency for calibration. Pattern-generation logic integrated with interleaved ADC 730 may also be enabled to generate suitable analog input AIN signals for calibration.

Figure 13A:
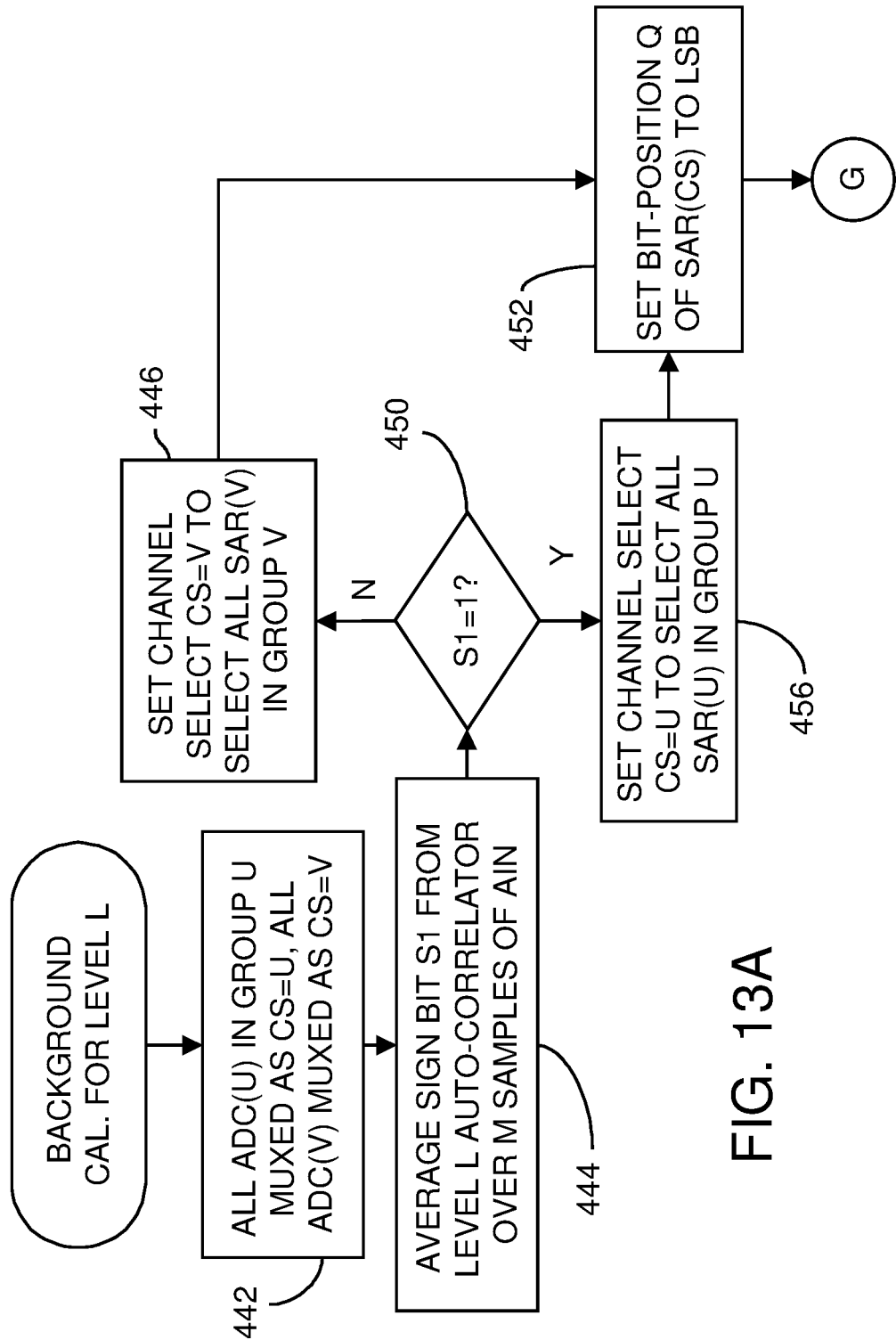
FIGS. 13A-13B show a flowchart of a background calibration process.
Figure 13B:
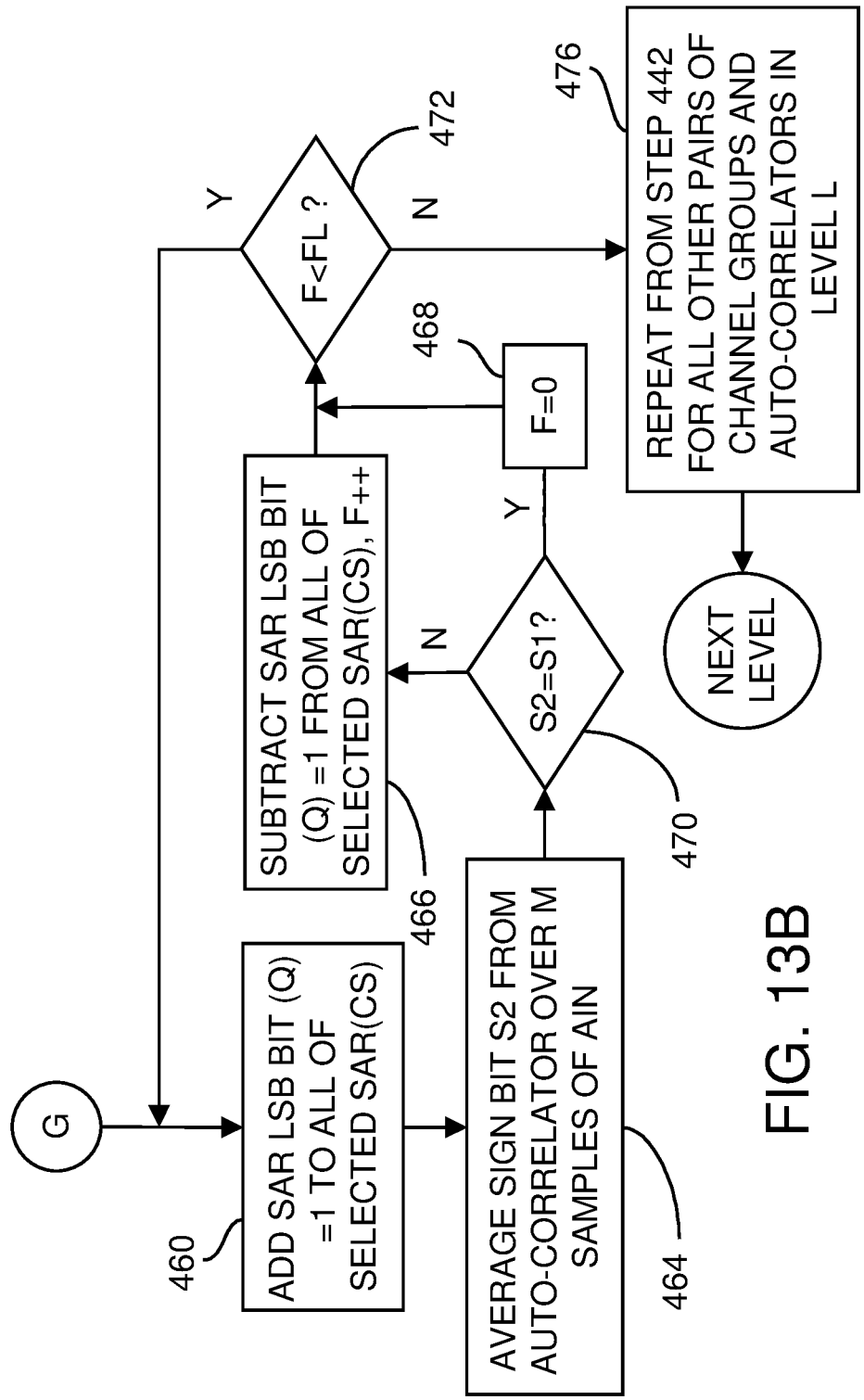

FIGS. 13A-13B show a flowchart of a background calibration process. Background calibration is performed after foreground calibration has completed and calibrated delays are loaded into all of SAR delay 40, 42, 43, 44, . . . .

In FIG. 13A, arbitrary level L may have several auto-correlators, each with a different set of channels in its group U and another set of channels in its group V. Channels in group U are identified by channel select CS=U, and have their ADC outputs muxed together as a first input to the group-pair's auto-correlator, while channels in group V are identified as CS=V, and have their ADC outputs muxed together as the second input of the auto-correlator, step 342.

The sign bit SIGN from level-R auto-correlator for the group-pair UV is averaged as S1 over M samples of analog input AIN, step 444. When the averaged sign bit S1 is 1, step 450, YM(U)[K]*YM(V)[K−1]−YM(U)[K−1]*YM(V)[K−1] was negative on average over the M samples. The sign is for a negative number, so ΔT(YM(U),YM(V)) is positive. A delay should be added to every SAR delay element (SAR delay 40, etc.) SAR(U) in every channel in group U to decrease ΔT(YM(U),YM(V)). The channel select CS is set to U, step 456.

When the averaged sign bit S1 is 0, step 450, YM(U)[K]*YM(V)[K−1]−YM(U)[K−1]*YM(V)[K−1] was positive on average over the M samples. The sign is for a positive number, so ΔT(YM(U),YM(V)) is negative. A delay should be added to every SAR delay SAR(V) in every channel in group V to increase ΔT(YM(U),YM(V)). The channel select CS is set to V, step 446.

The bit-position Q is set to the LSB for this level L, step 452. Q is the bit-position in every SAR(U) when CS=U, or in every SAR(V) when CS=V. The MSB is used for foreground calibration when large changes in delay are desirable to more rapidly converge on the calibration result. However the LSB is used for background calibration, since the drift is not expected to be large, so slower adjustments are more desirable for background calibration.

In FIG. 13B, the bit for current bit-position Q (the LSB) is set high and added to the existing values in every SAR delay SAR(CS) for every channel in selected group U or V, step 460. The sign bit SIGN from the current auto-correlator is averaged as S2 over M samples of analog input AIN, step 464. When the averaged sign bit S2 is the same as S1, step 470, then the extra added capacitance added in step 460 was not sufficient to change the sign of the correlated error and the polarity of ΔT. The extra capacitance and delay added in step 460 should remain enabled during further testing. Flip indicator F is cleared, step 468.

When the averaged sign bit S2 is the opposite of S1, step 470, the extra capacitance added in step 460 was too much. The added capacitance and delay changed the sign of the correlated error and the polarity of ΔT. The extra capacitance and delay that was added in step 460 is removed by subtracting the added LSB bit Q in all SAR(CS) for the selected channel group U or V, step 466. Step 466 is an undo of step 460. The flip indicator F is incremented.

When the flip indicator F is less than the flip limit FL, step 472, then another LSB is added to all SAR(CS) in selected channel CS, either U or V, step 460. A new sign bit S2 is averaged with the new setting of SAR(CS), step 464, and the added LSB bit is subtracted when S2 is not equal to the original sign bit S1, steps 470, 466.

This process repeats by adding 1 LSB in steps 460-472 until F reaches the flip limit FL, step 472. The flip limit FL can be set to as little as 1, or to a larger value for better robustness.

Then the process repeats from step 442 for any other group-pair U, V, step 476. One all possible group-pairs U, V in level L are processed, then next level L+1 in the binary tree of auto-correlators can be processed by repeating from step 442 for level L=L+1. The final level L has only one group-pair and one auto-correlator.

Figure 14:
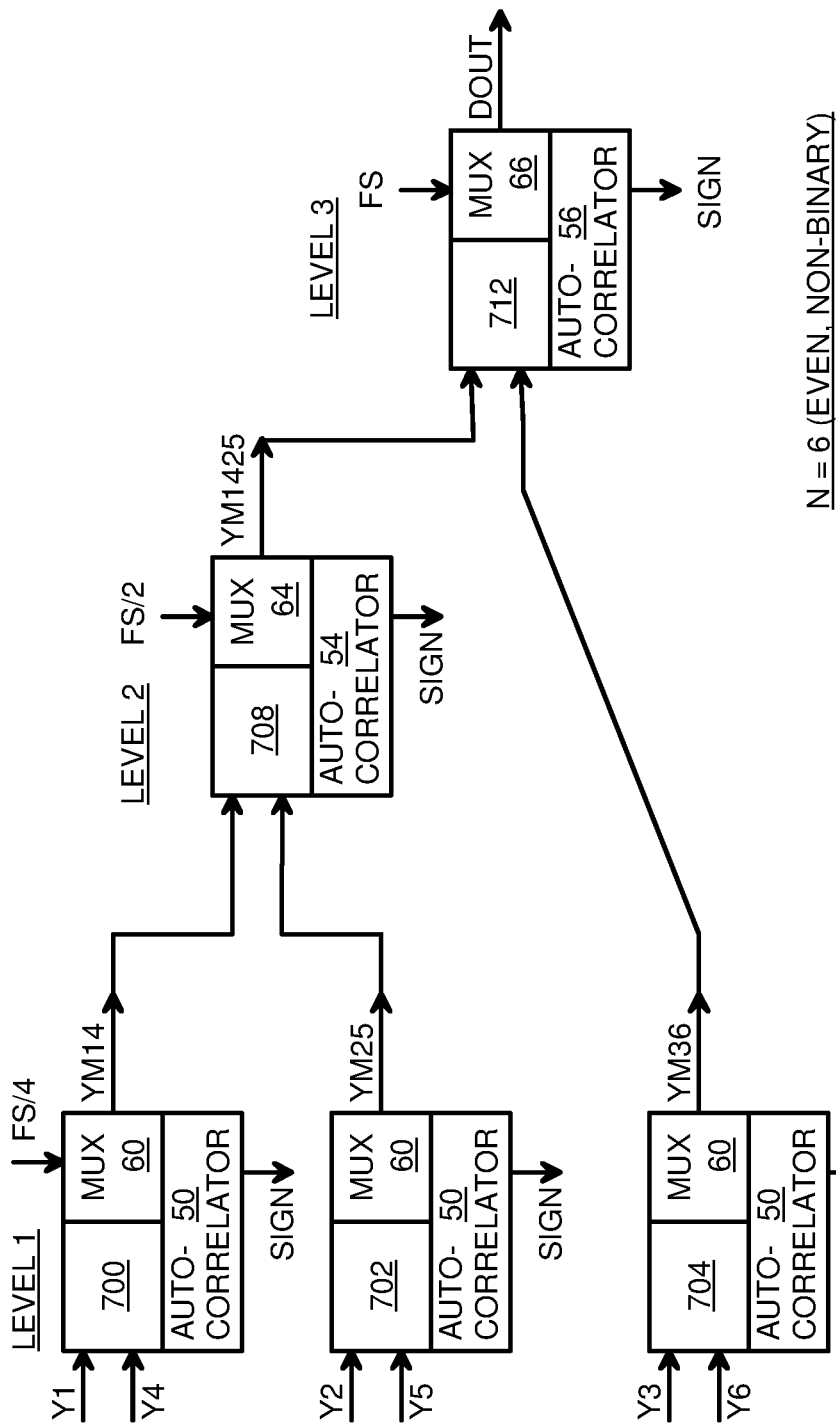
FIG. 14 shows a non-binary tree of auto-correlators and muxes.

FIG. 14 shows a non-binary tree of auto-correlators and muxes. While a binary tree is very efficient, there may be a non-binary number of ADC channels N. For example, there may be N=6 ADC channels that generate outputs Y1, Y2, Y3, . . . Y6.

There are N/2=3 mux-correlators 700, 702, 704 in level 1 in the non-binary tree for N=6 channels. Level 2 has a single mux-correlator 708 that receives the mux outputs YM14 from mux-correlator 700 and YM25 from mux-correlator 702 in level 1.

The level-1 mux output YM36 from mux-correlator 704 bypasses level 2 and is input directly to level-3 mux-correlator 712, which also receives YM1425 from mux-correlator 708 in level 2.

Level-3 mux-correlator 712 operates at Fs, level-2 mux-correlator 708 operates at Fs/2, and level-1 mux-correlators 700, 702, 704 operate at Fs/4. Other non-binary even values of N could be substituted and the non-binary tree adjusted as needed.

Figure 15:
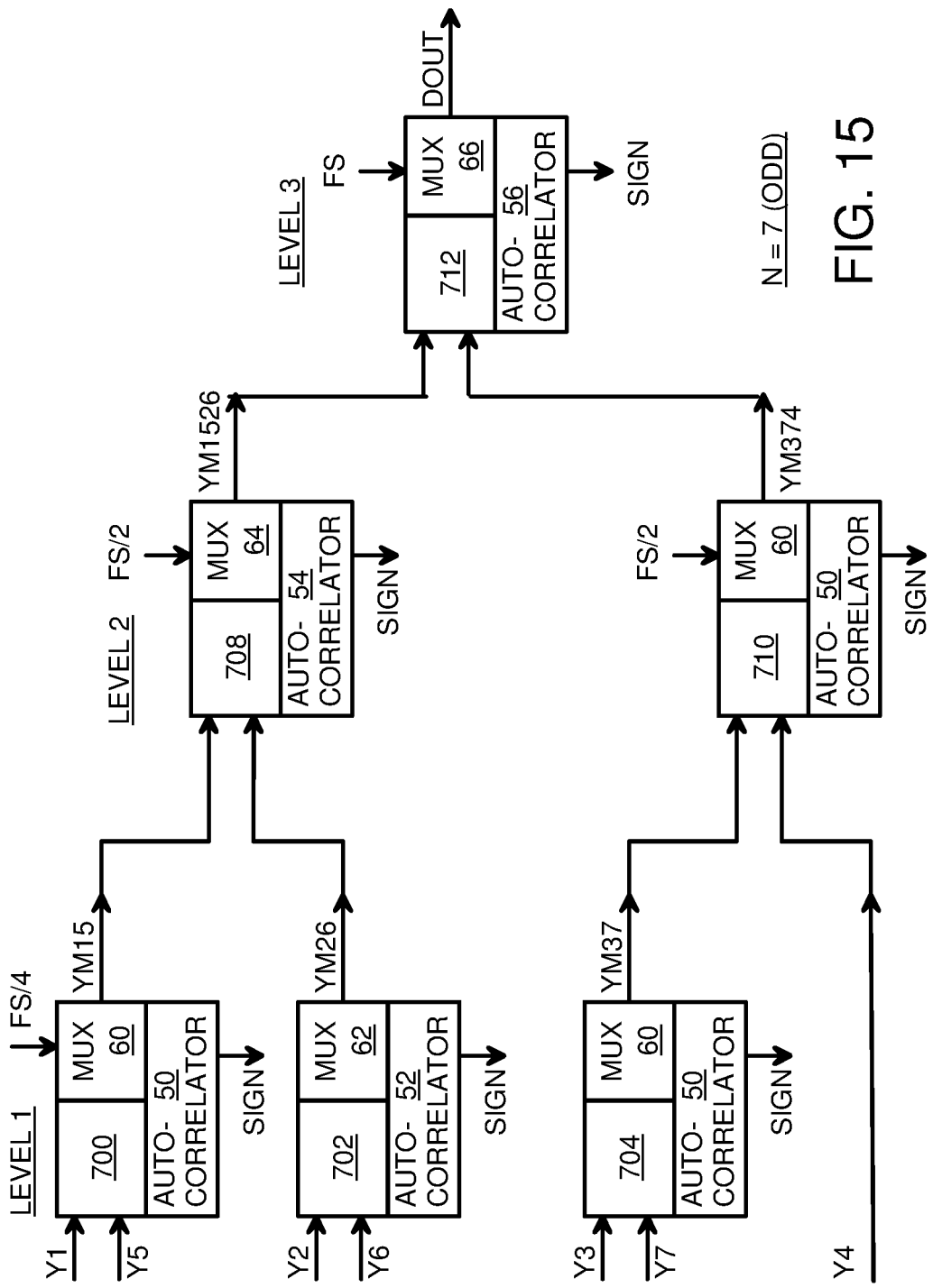
FIG. 15 shows a non-binary odd tree of auto-correlators and muxes.

FIG. 15 shows a non-binary odd tree of auto-correlators and muxes. In this alternative, there are and odd number N=7 ADC channels that generate outputs Y1, Y2, Y3, . . . Y7.

There are N/2=3 mux-correlators 700, 702, 704 in level 1 in the non-binary tree for 6 of the N=7 channels. Level 2 has two mux-correlators 708, 710. Mux-correlator 708 receives the mux outputs YM15 from mux-correlator 700 and YM26 from mux-correlator 702 in level 1.

Mux-correlator 710 receives mux output YM37 from mux-correlator 704 and Y4 directly from ADC4, which bypasses level-1.

Level-3 mux-correlator 712 receives YM1526 from mux-correlator 708 and YM374 from mux-correlator 710 in level 2.

Level-3 mux-correlator 712 operates at Fs, level-2 mux-correlators 708, 710 operate at Fs/2, and level-1 mux-correlators 700, 702, 704 operate at Fs/4. Other odd non-binary values of N could be substituted and the non-binary tree adjusted as needed.

FIG. 16 shows FIR filtering of ADC outputs. Finite-Impulse-Response (FIR) filter 740 can be inserted on each ADC output Y(J) before input to auto-correlator 50. The muxing is performed directly on the ADC outputs Y(J) without FIR filtering. FIR filter 740 can also be added to the muxed inputs to auto-correlator 54 on level-2, or on any other auto-correlators at higher levels.

FIR filter 740 can act as a lowpass or bandpass filter for calibration, as long as the polarity of its autocorrelation derivatives is known. FIR filtering can help define the polarity of its autocorrelation derivatives to a well-defined value or specification to calibrate the interleaved ADC for a known frequency range. Since autocorrelation derivatives are frequency dependent, FIR filtering can prevent any potential convergence problems during calibration.

Theoretical Model of Interleaved ADC

Figure 17:
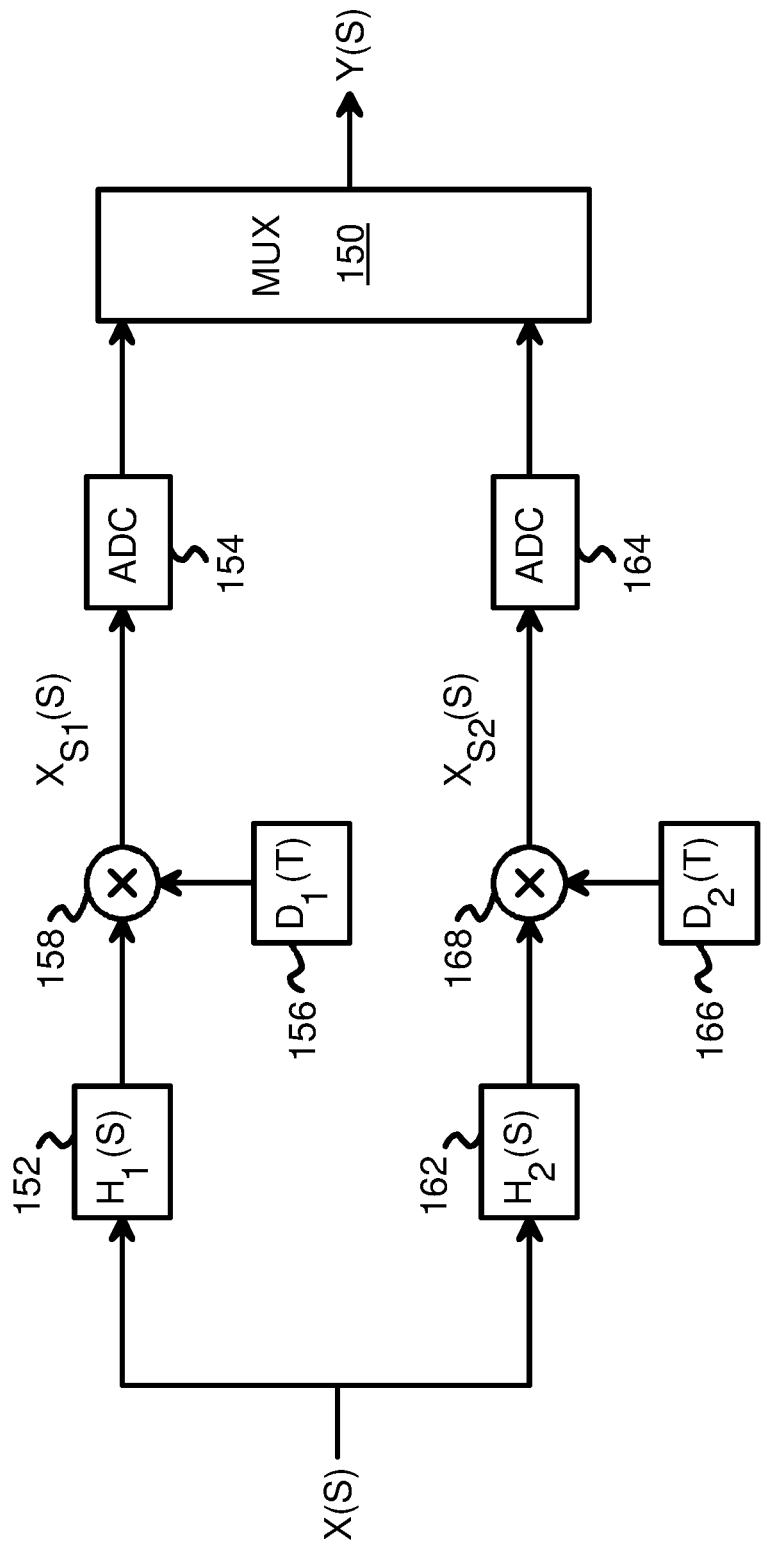
FIG. 17 shows a model of an interleaved ADC.

FIG. 17 shows a model of an interleaved ADC. An analog input X(S) is sampled by first sampler 152 as function $H_1(S)$, which is multiplied by first multiplier 158 with first delay 156 $D_1(T)$ to generate $X_{S1}(S)$ that is input to first ADC 154. In the second channel, analog input X(S) is also sampled by second sampler 162 as function $H_2(S)$, which is multiplied by second multiplier 168 with second delay 166 $D_2(T)$ to generate $X_{S2}(S)$ that is input to second ADC 164. The digital outputs of first ADC 154 and second ADC 164 are muxed together by mux 150 to generate output Y(S).

The following equations and discussion are presented as a theoretical background and is not intended to limit the invention or its claims but are presented for edification.

Assuming a single-pole sampling system, sampled analog signal (odd) and (even) are given by:

$$X_{S1}(s) = H_1(s) \times \left[ \frac{1}{T_s} \sum_{k=-\infty}^{\infty} X\left(j\left(\omega - \frac{2\pi k}{T_s}\right)\right) \right]$$

$$X_{S2}(s) = H_2(s) \cdot e^{-j2\pi k \frac{\Delta T}{T_s}} \times \left[ \frac{1}{T_s} \sum_{k=-\infty}^{\infty} X\left(j\left(\omega - \frac{2\pi k}{T_s}\right)\right) \right] e^{-jk\pi}$$

Therefore, digital output Y(s) is given by:

$$Y(s) = X_{S1}(s) +$$

$$X_{S2}(s) = \left[ \frac{1}{T_s} \sum_{k=-\infty}^{\infty} X\left(j\left(\omega - \frac{2\pi k}{T_s}\right)\right) \right] \times \left[ H_1(s) + e^{-jk\pi} H_2(s) \cdot e^{-j2\pi k \frac{\Delta T}{T_s}} \right]$$

Ideally, if $H_1(s)=H_2(s)=H(s)$ and $\Delta T=0$, then $$Y_{ideal}(s) = \frac{1}{T_S'} \sum_{n=-\infty}^{\infty} X\left(j\left(\omega - \frac{2\pi n}{T_S'}\right)\right) \text{ where } T_S' = \frac{T_S}{2}$$

Odd image replica from $H_2(s)$ is well-cancelled with $H_1(s)$, in other words, bandwidth of X(s) could be double due to ping-pong sampling system as expected. However, error image (i.e. uncorrected odd image replica) exists in reality due to $H_1(s) \neq H_2(s)$ if $\Delta T \neq 0$.

Herein, we would like to approximate the error due to finite bandwidth mismatch and timing skew as below:

$$Y(s) = Y_{ideal}(s) + E_Y(s) = Y_{ideal}(s) + Y_{ideal}(s) \times \left[ H_1(s) - H_2(s) \cdot e^{-j2\pi m \frac{\Delta T}{T_s}} \right]$$

where m is odd #.

This provides the basis analysis on the effect of "dynamic error" in the proposed ADC system. Our target is to evaluate the frequency response of E(s), basically, exponential term can be generalized into:

$$e^{-j2\pi \frac{\Delta T}{T_s}} \rightarrow e^{-s\Delta T}$$

Consequently, equivalent frequency response of two sampling systems converges into $$E(s) = H_1'(s) - H_2'(s)$$

Consider the case in ping-pong sampling with mismatches, we have the following:

$$H_1'(s) = \frac{1}{1 + \frac{s}{\omega_o}}$$

$$H_2'(s) = \frac{e^{-s\Delta T}}{1 + \frac{s}{\omega_o + \Delta\omega}}$$

(where $\Delta t$ denotes the timing skew mismatch in channel 2 relative to channel 1, $\Delta\omega$ denotes the finite bandwidth mismatch in channel 2 relative to channel 1)

Equivalently, it becomes:

$$H_1'(s) = \frac{1}{1 + \frac{s}{\omega_o}}$$

and $$H_2'(s) = \frac{e^{-s\Delta T}}{1 + \frac{s}{\omega_o\left(1 + \frac{\Delta\omega}{\omega_o}\right)}}$$

Herein, we exclude the effect of gain mismatches on $H_1'(s)$ and $H_2'(s)$ because it is not input freq. dependent if cross products terms are negligible compared to fundamental terms.

Consider the "Dynamic Error" E(s), i.e.

$$E(s)=H_1'(s)-H_2'(s)$$

Equivalently, neglecting cross product terms, it becomes:

$$E(s) \approx -\left(\frac{\omega_o}{s+\omega_o}\right)\left[\frac{s}{s+\omega_o}\frac{\Delta\omega}{\omega_o} - \left(1+\frac{\Delta\omega}{\omega_o}\right)s\Delta T\right] \approx$$

$$-\left(\frac{1}{1+\frac{s}{\omega_o}}\right)\left[\underbrace{s\left(\frac{1}{1+\frac{s}{\omega_o}}\right)\left(\frac{1}{\omega_o}\right)\left(\frac{\Delta\omega}{\omega_o}\right)}_{E_{bw}(s)} \underbrace{-s\Delta T}_{E_{sk}(s)}\right]$$

$E_{bw}(s)$ and $E_{sk}(s)$ account the effect of finite bandwidth and timing-skew mismatches, respectively.

Clearly, if both $\Delta\omega=0$ and $\Delta T=0$, dynamic errors caused by finite bandwidth mismatch and timing skew is zero, respectively.

However, dynamic error always exists and therefore calibration is required to fulfill the target performance. As a result, the time derivatives for the dynamic error is of interest in our case. Consider the following:

$$E_{sk}(s) \approx \frac{s\Delta t}{1+\frac{s}{\omega_o}} = \left[s - s\left(\frac{s}{\omega_o}\right) + s\left(\frac{s}{\omega_o}\right)^2 - s\left(\frac{s}{\omega_o}\right)^3 + \ldots\right]\Delta T$$

$$E_{bw}(s) \approx -s\left(\frac{1}{1+\frac{s}{\omega_o}}\right)^2\left(\frac{\Delta\omega}{\omega_o}\right)\left(\frac{1}{\omega_o}\right) =$$

$$-\left[\left(\frac{s}{\omega_o}\right) - 2\left(\frac{s}{\omega_o}\right)^2 + 3\left(\frac{s}{\omega_o}\right)^3 - 4\left(\frac{s}{\omega_o}\right)^4 + \ldots\right]\left(\frac{\Delta\omega}{\omega_o}\right)$$

By taking "Inverse Laplace Transform" back to time domain, we have:

$$e_{sk}(t) \approx \left(\frac{\partial Y}{\partial t} - \frac{1}{\omega_o}\frac{\partial^2 Y}{\partial t^2} + \frac{1}{\omega_o^2}\frac{\partial^3 Y}{\partial t^3} - \frac{1}{\omega_o^3}\frac{\partial^4 Y}{\partial t^4} + \ldots\right)\Delta T$$

$$e_{bw}(t) \approx -\left(\frac{1}{\omega_o}\frac{\partial Y}{\partial t} - \frac{2}{\omega_o^2}\frac{\partial^2 Y}{\partial t^2} + \frac{3}{\omega_o^3}\frac{\partial^3 Y}{\partial t^3} - \frac{4}{\omega_o^4}\frac{\partial^4 Y}{\partial t^4} + \ldots\right)\left(\frac{\Delta\omega}{\omega_o}\right)$$

From equations above, $Y(s)=Y_{ideal}(s)\cdot H(s)=X(s)\cdot H(s)$ (i.e. filtered analog input signal).

Since H(s) is a desired response of loop filter common to ping-pong channels, the above equation is also identical to:

$$e_{sk}(t) \approx \left(\frac{\partial x}{\partial t} - \frac{1}{\omega_o}\frac{\partial^2 x}{\partial t^2} + \frac{1}{\omega_o^2}\frac{\partial^3 x}{\partial t^3} - \frac{1}{\omega_o^3}\frac{\partial^4 x}{\partial t^4} + \ldots\right)\Delta T$$

$$e_{bw}(t) \approx -\left(\frac{1}{\omega_o}\frac{\partial x}{\partial t} - \frac{2}{\omega_o^2}\frac{\partial^2 x}{\partial t^2} + \frac{3}{\omega_o^3}\frac{\partial^3 x}{\partial t^3} - \frac{4}{\omega_o^4}\frac{\partial^4 x}{\partial t^4} + \ldots\right)\left(\frac{\Delta\omega}{\omega_o}\right)$$

Notice that the effect of H(s) introduces finite gain error and phase shift according to input signal freq. that doesn't contribute odd image replica but the mismatch on two sampling systems.

In time domain, an earlier equation is converged linearly into:

$$y(t)=y_{ideal}(t)+e(t)=x(t)+e_{bw}(t)+e_{sk}(t)$$

Consider the absolute dynamic error signal e(t), $$e(t) \approx -\left[\left(\Delta T + \tau_{SAMP}\frac{\Delta\omega}{\omega_o}\right)\frac{\partial x}{\partial s} - \right.$$

$$\left.\left(\Delta T + 2\tau_{SAMP}\frac{\Delta\omega}{\omega_o}\right)\tau_{SAMP}\frac{\partial^3 x}{\partial t^2} + \left(\Delta T + 3\tau_{SAMP}\frac{\Delta\omega}{\omega_o}\right)\tau_{SAMP}^2\frac{\partial^3 x}{\partial t^2} + \ldots\right]$$

For instance, if $\Delta T=+/-1ps$, $\tau_{SAMP}=1/(2*\pi*5G)=32ps$ and $\Delta\omega/\omega_o=1\%$, first order error term is bounded by +/-1.064ps (in modern multi-GS/s ADC).

From the equation above, both $\Delta T$ and $\Delta\omega/\omega_o$ are somewhat related to signal/clock/component mismatches that could be reduced by properly layout and physical component sizing whereas $\tau_{SAMP}$ is circuit design parameter (PVT var.).

To mitigate the effect of dynamic errors, linearity performance (interleaving spur) can be reduced by design of a wider sampling bandwidth (lower $\tau_{SAMP}$) that tradeoff fundamentally with noise, power and other circuit design physical constraints.

From the above equation, it can be generalized into a Taylor Series Expansion error signal:

$$e(t) \approx -\left(\Delta t_1\frac{\partial x}{\partial t} - \Delta t_2\frac{\partial^2 x}{\partial t^2} + \Delta t_3\frac{\partial^3 x}{\partial t^3} - \Delta t_4\frac{\partial^4 x}{\partial t^4} + \ldots\right)$$

Consider a single carrier signal $x(t)=A\sin(\omega t)$, odd and even time derivatives are given by:

$$\frac{\partial x}{\partial t} = A\omega\cdot\cos(\omega t) \quad \frac{\partial^2 x}{\partial t^2} = -A\omega^2\cdot\sin(\omega t) \quad \frac{\partial^3 x}{\partial t^3} = -A\omega^3\cdot\cos(\omega t)$$

Error signal is proportional to amplitude A and Frequency of signal.

Error signals appears at 90 deg, 180 deg, 270 deg and so on (i.e. integer*Fs/2±Fin)→spurious tones. Both sampling pulse and finite bandwidth mismatches appears as pulse width difference error among channels. Therefore, it is possible to cancel it by adjusting the sampling pulse width via variable delay elements before samplers to align their effective sampling pulse width.

$$E_{\Delta T}[k]=y_1[k]y_2[k-1]-y_1[k-1]y_2[k-1]$$

$$E_{\Delta T}[k] = R_{12}\left[Ts - \frac{\Delta T}{2}\right] - R_{12}\left[-\left(Ts + \frac{\Delta T}{2}\right)\right]$$

$$= R_{12}\left[Ts - \frac{\Delta T}{2}\right] - R_{12}\left[\left(Ts + \frac{\Delta T}{2}\right)\right]$$

-continued $$\approx -\Delta T \frac{\partial R_{12}}{\partial \tau}\big|_{\tau=Ts}$$

Notice that time samples correlation=Autocorrelation.

$$\text{sign}\overline{(E_{\Delta T})} \approx \text{sign}\left(-\Delta T \overline{\frac{\partial R_{12}}{\partial \tau}\big|_{\tau=Ts}}\right)$$

By means of large number of samples (say 2^20 samples), the average value of it polarity indicate the direction of variable delay element whether delay should be increased or decreased like a comparator of SAR ADC.

Alternate Embodiments

Several other embodiments are contemplated by the inventors. For example clocks may be derived from other clocks and thus synchronized. Clocks may be buffered, enabled, and qualified by logic. The analog input signal may be buffered in a variety of ways and buffer arrangements or trees. While initial clearing of all bits in all SARs has been described, the SAR bits could all be initially cleared to a high state rather than to a low state. Active-low rather than active-high bit could be used.

Binary-weighted capacitors 110, 108, 106, 104, . . . 102 could be connected to the power-supply or to some other voltage rather than to ground. These capacitors may be enabled by p-channel or n-channel transistors, and the bits stored in SAR delay 40 may be active-high or active-low, and these bits may be encoded in various ways and need to be decoded by a decoder in SAR delay 40. While binary-weighted capacitors 110, 108, 106, 104, . . . 102 have been shown, these capacitors could have other weight sequences, such as 1C, 1C, 2C, 5C, 11C, 15C, etc., and the Successive-Approximation-Register (SAR) programming could be adjusted for these non-binary sequence of weights. Rather than having binary-weighted capacitors 110, 108, 106, 104, . . . 102, SAR delay 40 could employ other weighted delay elements, such as resistors, transistors or buffers of various sizes or weights. While binary-weighted capacitors have been described, other weightings could be substituted, such as decimally-weighted, prime-weighted, or linearly-weighted, or octal-weighted. The digital delay value in the SAR could be in these other number systems, such as octal numbers rather than binary numbers. Other kinds of delay elements could be substituted, such as parallel current sources, resistors, or various combinations, and in parallel, serial, or combined network arrangements. Values may be shifted, transformed, or processed in a variety of ways.

While auto-correlator 50 has been shown for a particular correlation, other correlation functions could be substituted and auto-correlator 50 adjusted to perform these substitute correlation functions. Inversions and complements may be added at various locations. Switches 20, 22, 23, 24 may be simple transistor switches, pass transistors, transmission gates, or other kinds of switches. Sample delay 146 may be implemented as a latch or other storage element or as a delay with combinational logic including NAND, NOR, XOR, XNOR gates. Rather than use capacitors for delay elements, MOSFETs, FinFETs, or other devices, either p-channel or n-channel, driven to power or ground, may be used as delay elements.

While a tree of auto-correlators 50 have been shown, auto-correlators 50 could be re-used or operate in various series and parallel arrangements. For example, all auto-correlators 50 for level-1 could operate in parallel when performing calibration for level 1, but then when performing calibration for level 2, the muxed outputs from level 1 muxes could be fed back to the inputs of half of the level-1 auto-correlators 50 to generate the level-2 sign bits for level-2 calibration. Thus, the level-1 hardware instances of auto-correlator 50 could be used for all levels of calibration, with level-1 auto-correlator 50 functioning as level-2 auto-correlator 54.

While operations have been described in a serial manner for easier understanding, parallel operation may be used. Calibration could be performed serially, one channel-pair at a time, or in parallel, where FIG. 8A-8B steps 204-234 are performed in parallel for each pair of ADC channels with a different auto-correlator 50 for each pair. When performed serially, a single instance of auto-correlator 50 could be used rather than separate instances of auto-correlator 50 in the hardware.

The process steps could be performed serially, or some steps may be performed in parallel. Various sequences may be adjusted or modified. Higher-level operations may be performed in software or firmware, such as SAR testing and decision logic, while lower-level functions may be performed in hardware, such as using auto-correlator 50 to generate the error sign bit. Some or all of the calibration routine could be replaced with hardware such as programmable logic, FPGA, or other logic gates on an Integrated Circuit (IC) or another chip. Various combinations of hardware, software, firmware, etc. may be substituted.

While 2:1 muxes have been shown with 2 inputs, larger muxes could be substituted, such as 4:1 muxes with 4 inputs, with the clock changing by a larger factor, such as 4. Auto-correlation could be performed on more than 2 inputs as another alternative. Analog input buffers could be rearranged, so that one analog input buffer drives 4 rather than 2 ADCs, or there may be a tree structure of analog input buffers with multiple levels. Higher-order muxes may be considered to be composed of multiple 2:1 muxes and thus be a special case of 2:1 mux implementation.

The number of samples averaged M could be different for foreground and background calibration and could even differ for different levels of the binary tree or for other reasons such as varying voltage or temperature conditions.

The analog input signal AIN does not have to be a sine wave, but could be other forms of AC signals, such as a triangular wave, sine waves of different frequencies that are superimposed, or any wireless baseband signal. When the polarity of the auto-correlation derivative can be determined, these signals may be used as input signals for calibration.

Averaging of the sign bit could be performed by setting a flip-flop for each 1 sign bit and clearing the flip-flop for each 0 sign bit.

A flip limit FL may be used for ending background calibration when incrementing the LSB keeps flipping the auto-correlation sign more than the FL times. Alternately, background calibration can end when the auto-correlation sign first flips.

The number of channels N can be binary, non-binary, even or odd, with adjustments to the tree of muxes and auto-correlators. While 4 channel interleaving has been shown in detail, 8-channel, 7-channel, 6-channel, 16-channel, 32-channel, or N-channel interleaved ADC's may be substituted. The interleave order of the channels may be changed. Interleaving may be nested or may be one long loop at level 1.

Additional components may be added at various nodes, such as resistors, capacitors, inductors, transistors, etc., and parasitic components may also be present. Enabling and disabling the circuit could be accomplished with additional transistors or in other ways. Pass-gate transistors or transmission gates could be added for isolation. Inversions may be added, or extra buffering. Capacitors may be connected together in parallel to create larger capacitors that have the same fringing or perimeter effects across several capacitor sizes. Switches could be n-channel transistors, p-channel transistors, or transmission gates with parallel n-channel and p-channel transistors, or more complex circuits, either passive or active, amplifying or non-amplifying.

The number of ADC digital bits may be adjusted. For example, a 15 bit ADC could be used, or an 8-bit, 6-bit, 22-bit, or 18-bit. A different number of bits could be substituted for a different precision, and the number of bits could be fixed or could be variable.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. An interleaved Analog-to-Digital Converter (ADC) comprising:
   a plurality of N channels, wherein N is a whole number of at least 4, wherein each of the plurality of N channels comprises:
   an ADC for converting a sampled analog input into a digital output having a digital value representing the sampled analog input;
   an analog switch that samples an analog input in response to a delayed clock;
   a Successive-Approximation-Register (SAR) that is programmed with a delay value during calibration;
   a variable delay element having a variable delay that is controlled by the delay value stored in the SAR, the variable delay element delaying an input sampling clock by the variable delay to generate the delayed clock to the analog switch;
   an output tree of mux-correlators, each mux-correlator comprising:
   a mux receiving a tree clock and a first tree input and a second tree input, the mux generating a tree output by using the tree clock to alternately select the first tree input and the second tree input for output as the tree output;
   an auto-correlator receiving the first tree input and the second tree input, the auto-correlator generating a correlation sign of a correlation of the first tree input with the second tree input;
   wherein the output tree further comprises a plurality of levels of mux-correlators including:
   a first level of mux-correlators that each receive the digital output from the ADC in a first channel in a pair of channels as the first tree input, and each receive the digital output from the ADC in a second channel in the pair of channels as the second tree input;
   a second level of mux-correlators that each receive the tree output from a first mux-correlator in the first level of mux-correlators as the first tree input, and each receive the tree output from a second mux-correlator in the first level of mux-correlators as the second tree input; and
   a final level of mux-correlators having a single mux-correlator that receives the tree output from a first mux-correlator in a preceding level of mux-correlators as the first tree input, and receives the tree output from a second mux-correlator in the preceding level of mux-correlators as the second tree input, the single mux-correlator outputting the tree output as a final digital value representing the analog input,
   wherein the SAR is programmed with delay values to compensate for timing skews among channels using a Successive-Approximation calibration routine that examines the correlation sign generated by the auto-correlator to determine when to accept or reject trial bits in the SAR of the channels input to the auto-correlator.

2. The interleaved ADC of claim 1 wherein the auto-correlator comprises:
   a first sample delay that delays the first tree input by one pulse of the tree clock to generate a first delayed sample;
   a second sample delay that delays the second tree input by one pulse of the tree clock to generate a second delayed sample;
   a first multiplier that multiplies the first tree input by the first delayed sample to generate a first product;
   a second multiplier that multiplies the second delayed sample by the first delayed sample to generate a second product;

an adder that subtracts the second product from the first product to generate a correlation value, and that selects a Most-Significant Bit (MSB) of the correlation value as the correlation sign.

3. The interleaved ADC of claim 2 wherein the variable delay element comprises a plurality of binary-weighted capacitors that are each enabled by a bit in the SAR.

4. The interleaved ADC of claim 2 wherein the auto-correlator in each mux-correlator in the first level further comprises:
a first Finite-Impulse-Response (FIR) filter for filtering the first tree input before input to the auto-correlator;
a second FIR filter for filtering the second tree input before input to the auto-correlator.

5. The interleaved ADC of claim 2 wherein the first level of mux-correlators comprises N/2 mux-correlators;
wherein the second level of mux-correlators comprises N/4 mux-correlators, wherein N/4 is rounded down to a nearest whole number when N/4 is not a whole number;
wherein the final level of mux-correlators comprises 1 mux-correlator;
wherein a number of levels of mux-correlators is $\log_2 (N)$, rounded up to a nearest whole number;
wherein the mux-correlators form a tree structure.

6. The interleaved ADC of claim 5 wherein N is a non-binary number;
wherein the mux-correlators form a non-binary tree structure.

7. The interleaved ADC of claim 6 wherein N is an odd number;
wherein N/2 is rounded down to a nearest whole number when N is an odd number;
wherein the mux-correlators form a non-binary odd-number tree structure.

8. The interleaved ADC of claim 2 further comprising:
a Successive-Approximation calibrator operating with each auto-correlator in the output tree, the Successive-Approximation calibrator averaging the correlation sign from the auto-correlator over M analog input samples, where M is a whole number, to generate an averaged sign bit, using the averaged sign bit to select a selected group of SAR that adjust input delays for the ADC for all channels that feed into either the first tree input or the second tree input, (a) adding a test bit-position to the SAR of the selected group and generating a test averaged sign bit over multiple analog input samples, subtracting the test bit-position when the test averaged sign bit is not equal to the averaged sign bit, and repeating from (a) for successively smaller bit-positions in the SAR,
whereby and average of the correlation sign of each auto-correlator in each level of the output tree is used to add or subtract successive bit-positions in the SAR for all channels in the selected group that feed into either the first tree input or the second tree input to the auto-correlator.

9. The interleaved ADC of claim 8 wherein the tree clock applied to the final level has a final frequency;
wherein the tree clock applied to the preceding level has a frequency that is the final frequency divided by 2;
wherein the tree clock applied to the first level has a frequency that is the final frequency divided by N.

10. The interleaved ADC of claim 9 wherein the tree clock applied to an intermediate level L has a frequency that is the final frequency divided by 2 times [$\log_2 (N)$–L], wherein L is a whole number that is less than $\log_2 (N)$–L.

11. The interleaved ADC of claim 8 wherein the input sampling clock is the tree clock divided by 2 times [$\log_2 (N)$–1].

12. The interleaved ADC of claim 8 wherein the digital output from the ADC is at least 6 bits.

13. A calibration method for reducing timing skews among channels in an interleaved Analog-to-Digital Converter (ADC) comprising:
clearing all bits in all Successive-Approximation-Registers (SARs) that set variable input delays from an analog input to ADCs that are interleaved together, each ADC sampling the analog input and generating an ADC digital output;
wherein each channel has a SAR, an ADC, and an input delay element having a variable input delay set by the SAR;
for each pair of channels in a first level:
inputting the ADC digital outputs from two ADCs in a pair of channels to an auto-correlator that generates a sign of an auto-correlation function of the ADC digital outputs, and averaging the sign over multiple samples of the analog input to generate an averaged sign;
examining the averaged sign to select either a first channel or a second channel in the pair of channels as a selected channel;
setting a current bit-position to a level-1 Most-Significant Bit (MSB) position in the SARs;
(a) setting a test bit at the current bit-position in the SAR of the selected channel to adjust the variable input delay and averaging the sign generated by the auto-correlator over multiple samples of the analog input to generate a test sign;
when the test sign does not match the averaged sign, clearing the test bit;
decreasing the current bit-position and repeating from (a) until the current bit-position is a Least-Significant Bit (LSB) in the SAR;
wherein each auto-correlator in a second level has a first input that alternately receives the ADC digital outputs from a first pair of channels, and a second input that alternately receives the ADC digital outputs from a second pair of channels;
wherein the first pair of channels is a first group of channels;
wherein the second pair of channels is a second group of channels;
wherein each auto-correlator in a higher level above the second level has a first input that alternately receives the ADC digital outputs from a first group of channels, and a second input that alternately receives the ADC digital outputs from a second group of channels;
for each auto-correlator in the second level and in the higher level:
using the auto-correlator to generate a sign of an auto-correlation function of the ADC digital outputs muxed together into the first input and into the second input, and averaging the sign over multiple samples of the analog input to generate an averaged sign;
examining the averaged sign to select either the first group of channels or the second group of channels as a selected group of channels;
setting a current bit-position to a current-level Most-Significant Bit (MSB) position in the SARs for a current level;

(b) adding a test bit at the current bit-position to a prior delay setting in the SAR for each channel in the selected group of channels to adjust the variable input delay, and averaging the sign generated by the auto-correlator over multiple samples of the analog input to generate the test sign;

when the test sign does not match the averaged sign, subtracting the test bit in the SAR for each channel in the selected group of channels;

decreasing the current bit-position and repeating from (b) until the current bit-position is a Least-Significant Bit (LSB) in the SAR; and ending calibration when all auto-correlators in all levels have been used to adjust settings in the SARs to adjust the variable input delays to minimize timing skews among all channels.

14. The calibration method of claim 13 wherein for auto-correlators in the first level, the first input is the ADC digital output from a first ADC in the pair of channels to the auto-correlator, and the second input is the ADC digital output from a second ADC in the pair of channels to the auto-correlator, the first group of channels is the first channel with the first ADC in the pair of channels, and the second group of channels is the second channel with the second ADC in the pair of channels;

further comprising:

a background calibration routine activated to adjust settings in the SARs that were previously set by calibration, the background calibration routine comprising for each auto-correlator:

using the auto-correlator to generate a sign of an auto-correlation function of the first input and the second input, and averaging the sign over multiple samples of the analog input to generate an averaged sign;

examining the averaged sign to select either the first group of channels or the second group of channels as a selected group of channels;

setting a current bit-position to a Least-Significant Bit (LSB) position in the SARs;

(b) adding a test bit at the current bit-position to a prior delay setting in the SAR for each channel in the selected group of channels to adjust the variable input delay, and averaging the sign generated by the auto-correlator over multiple samples of the analog input to generate the test sign;

when the test sign matches the averaged sign, repeating from (b); and when the test sign does not match the averaged sign, subtracting the test bit in the SAR for each channel in the selected group of channels and ending calibration for the auto-correlator; and ending background calibration when all auto-correlators in all levels have been used to adjust settings in the SARs to adjust the variable input delays to minimize timing skews among all channels.

15. The calibration method of claim 13 wherein all auto-correlators in a level are calibrated in parallel.

16. The calibration method of claim 13 wherein a physical auto-correlator is re-used for multiple levels of auto-correlators that are processed serially.

17. The calibration method of claim 13 wherein the auto-correlators are arranged into a tree structure, wherein there are N/2 auto-correlators in the first level, N/4 auto-correlators in the second level, and 1 auto-correlator in a final level, wherein N is a whole number of 4 or more.

18. The calibration method of claim 17 wherein N is a non-binary whole number, and N/4 and N/2 are rounded down to a whole number.

19. A calibrating interleaved Analog-to-Digital Converter (ADC) comprising:

a plurality of N channels, wherein N is a whole number of at least 4, each channel comprising:

an ADC having a sampled analog input and a digital output;

a sampling switch between an analog input and the sampled analog input, the sampling switch responsive to a delayed clock;

a Successive-Approximation-Register (SAR) that stores a delay setting;

a delay element generating a variable delay between an input clock and the delayed clock, wherein the variable delay is determined by the delay setting in the SAR;

an output tree of mux-correlators, each mux-correlator comprising:

a first input and a second input;

a mux that outputs the first input as a tree output when a level clock is in a first state, and outputs the second input as the tree output when the level clock is not in the first state;

an auto-correlator that generates a sign of a self-correlation function that receives the first input and the second input to the mux;

wherein the output tree has N/2 mux-correlators in a first level, wherein each of the N/2 mux-correlators in the first level receives the digital output from an ADC in a first channel in a channel pair in the plurality of N channels as the first input, and receives the digital output from the ADC in a second channel in the channel pair in the plurality of N channels as the second input;

wherein the output tree has N/4 mux-correlators in a second level, wherein each of the N/4 mux-correlators in the second level receives the tree output from a first mux-correlator in the first level as the first input, and receives the tree output from a second mux-correlator in the first level as the second input;

wherein the output tree has a single mux-correlator in a final level, wherein the single mux-correlator in the final level receives the tree output from a first mux-correlator in a preceding level as the first input, and receives the tree output from a second mux-correlator in the preceding level as the second input, the mux-correlator outputting the tree output as a final digital output for the calibrating interleaved ADC; and a calibrator, using the sign from each auto-correlator to decide when to add a test bit to the SAR, and when to remove the test bit from the SAR, for the SAR for all channels inputting to the first input or to the second input of the auto-correlator.

20. The calibrating interleaved ADC of claim 19 wherein the calibrator further comprises:

an average for averaging the sign bit from the auto-correlator over M analog input samples, where M is a whole number, to generate an averaged sign bit;

a selector, using the averaged sign bit to select a selected group of SAR that adjust delay settings in the SAR for all channels that feed into either the first input or the second input;

a tester for adding a test bit-position to the SAR of the selected group and generating a test averaged sign bit over multiple analog input samples, and for subtracting the test bit-position when the test averaged sign bit is not equal to the averaged sign bit, and repeating for successively smaller bit-positions in the SAR, whereby the sign bit of each auto-correlator in each level of the output tree is used to add or subtract successive bit-positions in the SAR for all channels in the selected group that feed into either the first input or the second input to the auto-correlator.

* * * * *